United States Patent
Song et al.

(10) Patent No.: US 10,811,634 B2
(45) Date of Patent: Oct. 20, 2020

(54) LIGHT EMITTING DISPLAY PANEL AND ELECTRONIC DEVICE INCLUDING THE SAME

(71) Applicant: Samsung Display Co., Ltd., Yongin-Si, Gyeonggi-Do (KR)

(72) Inventors: Hyun-gue Song, Hwaseong-si (KR); Heeseong Jeong, Seoul (KR); Dahye Kim, Yongin-si (KR); Sunhwa Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 60 days.

(21) Appl. No.: 16/162,146

(22) Filed: Oct. 16, 2018

(65) Prior Publication Data
US 2019/0198810 A1    Jun. 27, 2019

(30) Foreign Application Priority Data
Dec. 21, 2017   (KR) .................. 10-2017-0177447

(51) Int. Cl.
| | |
|---|---|
| H01L 51/52 | (2006.01) |
| H01L 27/32 | (2006.01) |
| H01L 51/50 | (2006.01) |
| G09G 3/3208 | (2016.01) |

(52) U.S. Cl.
CPC ....... *H01L 51/5256* (2013.01); *G09G 3/3208* (2013.01); *H01L 27/323* (2013.01); *H01L 27/3211* (2013.01); *H01L 51/5012* (2013.01); *H01L 51/5036* (2013.01); *H01L 51/5206* (2013.01); *H01L 51/5221* (2013.01); *H01L 51/5246* (2013.01); *H01L 51/5265* (2013.01); *H01L 51/5275* (2013.01);
(Continued)

(58) Field of Classification Search
CPC ...................................... H01L 51/52
See application file for complete search history.

(56) References Cited

U.S. PATENT DOCUMENTS

| | | |
|---|---|---|
| 8,866,383 B2 | 10/2014 | Jang et al. |
| 8,928,013 B2 | 1/2015 | Matsuda |
| 2012/0153421 A1 | 6/2012 | Kawamura |

(Continued)

FOREIGN PATENT DOCUMENTS

| | | |
|---|---|---|
| EP | 3041061 A1 | 7/2016 |
| EP | 3151300 A1 | 4/2017 |

(Continued)

OTHER PUBLICATIONS

"Simulation of light emission from thin-film Microcavities" Kristiaan A. Neyts, J. Opt. Soc. Am. A, vol. 15, No. 4, Apr. 1998.

(Continued)

*Primary Examiner* — Marvin Payen
(74) *Attorney, Agent, or Firm* — Innovation Counsel LLP

(57) ABSTRACT

By controlling the optical thickness of the upper stacked structure disposed on the display panel, it is possible to periodically control the tristimulus value of Xr and the tristimulus value of Yg emitted from the electronic device. The optical thickness is determined by the thickness and refractive index of the upper stacked structure. This control may reduce the tristimulus value of Xr periodically or increase the tristimulus value of Yg periodically. The tristimulus value of Xr may be periodically decreased and the tristimulus value of Yg may be periodically increased at the same time.

6 Claims, 16 Drawing Sheets

(52) U.S. Cl.
CPC . *H01L 51/5281* (2013.01); *G09G 2320/0666* (2013.01); *H01L 2251/558* (2013.01)

(56) References Cited

U.S. PATENT DOCUMENTS

2012/0211782 A1    8/2012   Masuda et al.
2017/0125505 A1    5/2017   Oh

FOREIGN PATENT DOCUMENTS

| | | |
|---|---|---|
| JP | 2011119233 A | 6/2011 |
| JP | 5683094 B2 | 3/2015 |
| JP | 2017219552 A | 12/2017 |
| KR | 10-2014-0007691 A | 1/2014 |
| KR | 10-2016-0072643 A | 6/2016 |

OTHER PUBLICATIONS

"CIE 1931 color space" [online], Wikipedia [retrieved on May 29, 2018], Retrieved from the Internet: <URL: https://en.wikipedia.org/wiki/CIE_1931_color_space>.

"Radiance" [online], Wikipedia [retrieved on May 29, 2018], Retrieved from the Internet: <URL: https://en.wikipedia.org/wiki/Radiance>.

Nedhal A. Mahmood, Effect of annealing temsperature on some optical properties of Lif thin films, Diyala Juornal for Pure Sciences, Oct. 2011, 9 pages, vol. 7 No. 4, ISSN: 2222-8373, Diyala Juornal for Pure Sciences.

Extended European Search Report, Application No. 18215762.8, dated May 24, 2019, 28 pages.

LIGHT EMITTING DISPLAY PANEL AND ELECTRONIC DEVICE INCLUDING THE SAME

CROSS-REFERENCE TO RELATED APPLICATIONS

This U.S. non-provisional patent application claims priority under 35 U.S.C. § 119 to Korean Patent Application No. 10-2017-0177447, filed on Dec. 21, 2017, the entire contents of which are hereby incorporated by reference.

BACKGROUND

The present disclosure relates to a light emitting display panel and an electronic device, and more particularly to a light emitting display panel and an electronic device with improved display quality.

Electronic devices such as smart phones, tablets, notebook computers, navigations, and smart televisions are being developed. These electronic devices have a display panel for providing information. Electronic devices include a variety of electronic modules in addition to the display panel.

Electronic devices should meet display quality requirements for their intended use. The light generated from the light emitting element is emitted to the outside of the electronic device while generating various optical phenomena such as a resonance and interference. This optical phenomenon may affect the quality of the displayed image.

SUMMARY

The present disclosure provides a display panel with improved display quality.

The present disclosure also provides an electronic device with reduced reddishness of white images.

An embodiment of the inventive concept provides a light emitting display panel including: a base layer; a light emitting element including a first electrode disposed on the base layer, a light emitting layer disposed on the first electrode, and a second electrode disposed on the light emitting layer; and a stacked structure disposed on the light emitting element and including a plurality of layers, wherein a first layer to a q-th layer among the plurality of layers satisfy at least one of the following Equations 1 and 2. The first layer contacts with the second electrode.

$$2\pi m + \frac{2\pi}{3} < 2n_{1,z}d_1\sqrt{1 - \frac{1}{n_1^2}\sin^2\theta_{air}}\frac{2\pi}{\lambda} +$$
$$2n_{2,z}d_2\sqrt{1 - \frac{1}{n_2^2}\sin^2\theta_{air}}\frac{2\pi}{\lambda} \ldots 2n_{q,z}d_q$$
$$\sqrt{1 - \frac{1}{n_q^2}\sin^2\theta_{air}}\frac{2\pi}{\lambda} + \phi_{1,CE} + \phi_{q,q+1} < 2\pi m + \frac{4\pi}{3}$$
[Equation 1]

$$2\pi m + \frac{5\pi}{3} < 2n_{1,z}d_1\sqrt{1 - \frac{1}{n_1^2}\sin^2\theta_{air}}\frac{2\pi}{\lambda} +$$
$$2n_{2,z}d_2\sqrt{1 - \frac{1}{n_2^2}\sin^2\theta_{air}}\frac{2\pi}{\lambda} \ldots 2n_{q,z}d_q$$
$$\sqrt{1 - \frac{1}{n_q^2}\sin^2\theta_{air}}\frac{2\pi}{\lambda} + \phi_{1,CE} + \phi_{q,q+1} < 2\pi(m+1) + \frac{\pi}{3}$$
[Equation 2]

In Equations 1 and 2, m is 0 and a natural number, $n_{1,z}$ to $n_{q,z}$ are refractive indices in a thickness direction of each of the first layer to the q-th layer, $d_1$ to $d_q$ are respective thicknesses of the first layer to the q-th layer, $\theta_{air}$ is 20° to 40°, λ in Equation 1 is 610 nm or more and 645 nm or less, and λ in Equation 2 is 515 nm or more and 545 nm or less.

In Equations 1 and 2, $\Phi_{1,CE}$ is the following Equation 3, $$\phi_{1,CE} = \tan^{-1}\left(\frac{\text{Im}(r_{1,CE})}{\text{Re}(r_{1,CE})}\right)$$
[Equation 3]

In Equation 3, $r_{1,CE}$ is defined as a reflection coefficient of the first layer for the light emitting element, and if $\text{Im}(r_{1,CE}) \geq 0$, $0 \leq \phi_{1,CE} < \pi$ and if $\text{Im}(r_{1,CE}) < 0$, $\pi < \phi_{1,CE} < 2\pi$.

In Equations 1 and 2, if the refractive index of the q-th layer is larger than the refractive index of a q+1th layer, $\Phi_{q,q+1}$ is π and if the refractive index of the q-th layer is smaller than the refractive index of the q+1th layer, $\Phi_{q,q+1}$ is 0.

In an embodiment, the light emitting element may include a first light emitting element for generating blue light having a peak in a range of 440 nm to 460 nm; a second light emitting element for generating green light having a peak in a range of 515 nm to 545 nm; and a third light emitting element for generating red light having a peak in a range of 610 nm to 645 nm.

In an embodiment, the first layer to the q-th layer of the stacked structure may satisfy Equation 4 below.

$$n_{1,z}d_1 + n_{2,z}d_2 \ldots n_{q,z}d_q \leq 4000 \text{ nm}$$
[Equation 4]

In an embodiment, in Equation 4, q may be 3 to 5.

In an embodiment, the stacked structure may include a first organic layer, a first inorganic layer, a second inorganic layer, a second organic layer, and a third inorganic layer, which are sequentially stacked.

In an embodiment, the q-th layer may be the second inorganic layer.

In an embodiment, the first organic layer may include the same organic material as the light emitting element, wherein the thicknesses of the first organic layer and the first inorganic layer may be 300 nm or less.

In an embodiment, the first inorganic layer may include lithium fluoride.

In an embodiment, each of the second inorganic layer and the third inorganic layer may include at least one of silicon nitride, silicon oxynitride, silicon oxide, a titanium oxide, and aluminum oxide.

In an embodiment, a refractive index of the second inorganic layer may be 1.5 to 1.9, and a thickness of the second inorganic layer may be 800 nm to 2000 nm.

In an embodiment, a refractive index of the second organic layer may be 1.4 to 1.8, and a thickness of the second organic layer may be 1000 nm to 12000 nm.

In an embodiment, the q-th layer may be the second organic layer.

In an embodiment, a refractive index of the second organic layer may be 1.4 to 1.8, a thickness of the second organic layer may be 1000 nm to 2500 nm, wherein a refractive index of the second inorganic layer may be 1.5 to 1.9, and a thickness of the second inorganic layer may be 500 nm to 1600 nm.

In an embodiment, the stacked structure may include a first organic layer disposed directly on the light emitting element, a first inorganic layer disposed directly on the first organic layer, and an second organic layer and an second inorganic layer disposed on the first inorganic layer, wherein the q-th layer may be the second organic layer or the second inorganic layer.

In an embodiment of the inventive concept, an electronic device includes: a light emitting display panel; and a window disposed on the light emitting display panel, wherein when the light emitting display panel displays a single white image, a graph showing an intensity of light of the single white image measured at a height of 30 cm from the window and at a viewing angle of 20° to 40° in the CIE 1931 color coordinates is disposed on the left and top of a block body curve.

In an embodiment, the light emitting display panel may include: a first light emitting element configured to generate red light; a second light emitting element configured to generate green light; a third light emitting element configured to generate blue light; and interference layers disposed on the first light emitting element, the second light emitting element, and the third light emitting element, wherein the red light may be extinctively interfered in the interference layers, and the blue light may be constructively interfered in the interference layers.

In an embodiment, a first interference layer to a q-th interference layer (q is a natural number of 3 or more) among the interference layers may satisfy at least one of Equation 1 and Equation 2 below. The first interference layer contacts with the first light emitting element, the second light emitting element, and the third light emitting element.

$$2\pi m + \frac{2\pi}{3} < 2n_{1,z}d_1\sqrt{1-\frac{1}{n_1^2}\sin^2\theta_{air}}\frac{2\pi}{\lambda} +$$
$$2n_{2,z}d_2\sqrt{1-\frac{1}{n_2^2}\sin^2\theta_{air}}\frac{2\pi}{\lambda} \ldots 2n_{q,z}d_q$$
$$\sqrt{1-\frac{1}{n_q^2}\sin^2\theta_{air}}\frac{2\pi}{\lambda} + \phi_{1,CE} + \phi_{q,q+1} < 2\pi m + \frac{4\pi}{3}$$
[Equation 1]

$$2\pi m + \frac{5\pi}{3} < 2n_{1,z}d_1\sqrt{1-\frac{1}{n_1^2}\sin^2\theta_{air}}\frac{2\pi}{\lambda} +$$
$$2n_{2,z}d_2\sqrt{1-\frac{1}{n_2^2}\sin^2\theta_{air}}\frac{2\pi}{\lambda} \ldots 2n_{q,z}d_q$$
$$\sqrt{1-\frac{1}{n_q^2}\sin^2\theta_{air}}\frac{2\pi}{\lambda} + \phi_{1,CE} + \phi_{q,q+1} < 2\pi(m+1) + \frac{\pi}{3}$$
[Equation 2]

In Equations 1 and 2, m is 0 and a natural number, $n_{1,z}$ to $n_{q,z}$ are refractive indices in a thickness direction of each of the first layer to the q-th layer, $d_1$ to $d_q$ are respective thicknesses of the first layer to the q-th layer, $\theta_{air}$ is 20° to 40°, λ in Equation 1 is 610 nm or more and 645 nm or less, and λ in Equation 2 is 515 nm or more and 545 nm or less.

In Equations 1 and 2, $\Phi_{1,CE}$ is the following Equation 3, $$\phi_{1,CE} = \tan^{-1}\left(\frac{\text{Im}(r_{1,CE})}{\text{Re}(r_{1,CE})}\right)$$
[Equation 3]

In Equation 3, $r_{1,CE}$ is defined as a reflection coefficient of the first layer for the light emitting element, and if $\text{Im}(r_{1,CE}) \geq 0$, $0 \leq \phi_{1,CE} \leq \pi$ and if $\text{Im}(r_{1,CE}) < 0$, $\pi < \phi_{1,CE} < 2\pi$.

In Equations 1 and 2, if the refractive index of the q-th layer is larger than the refractive index of a layer disposed directly above the q-th layer, $\Phi_{q,q+1}$ is π and if the refractive index of the q-th layer is smaller than the refractive index of the layer disposed directly above the q-th layer, $\Phi_{q,q+1}$ is 0.

In an embodiment, a display surface where a single white image is displayed on the window may be defined by a first direction axis and a second direction axis, wherein a length of the display surface along the first directional axis is 10 cm to 20 cm.

In an embodiment, the electronic device may further include at least one of an input sensor and an anti-reflection layer disposed between the window and the light emitting display panel.

In an embodiment, the first interference layer to the q-th interference layer may satisfy Equation 4 below.

$$n_{1,z}d_1 + n_{2,z}d_2 \ldots n_{q,z}d_q \leq 4000 \text{ nm}$$
[Equation 4]

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
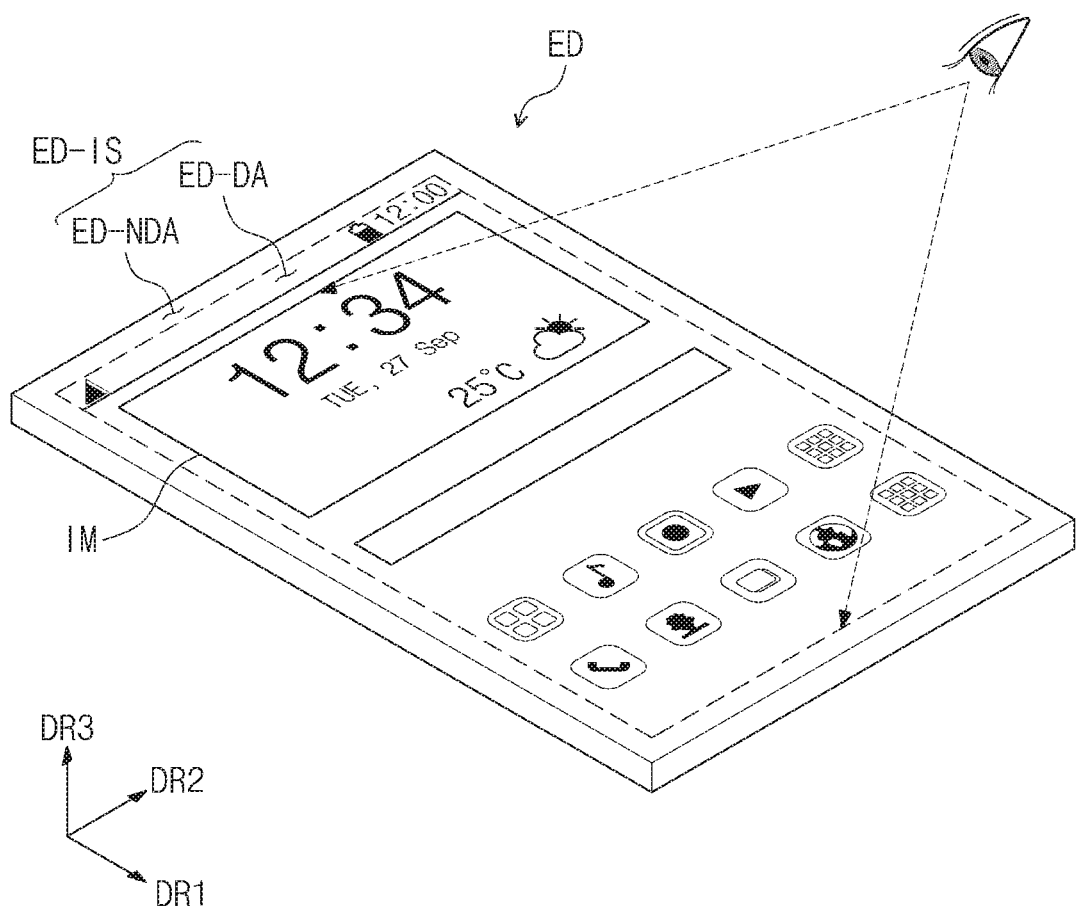
FIG. 1A is a perspective view of an electronic device according to an embodiment of the inventive concept.

Hereinafter, embodiments of the inventive concept will be described in more detail with reference to the accompanying drawings. In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the present disclosure. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Figure 1B:
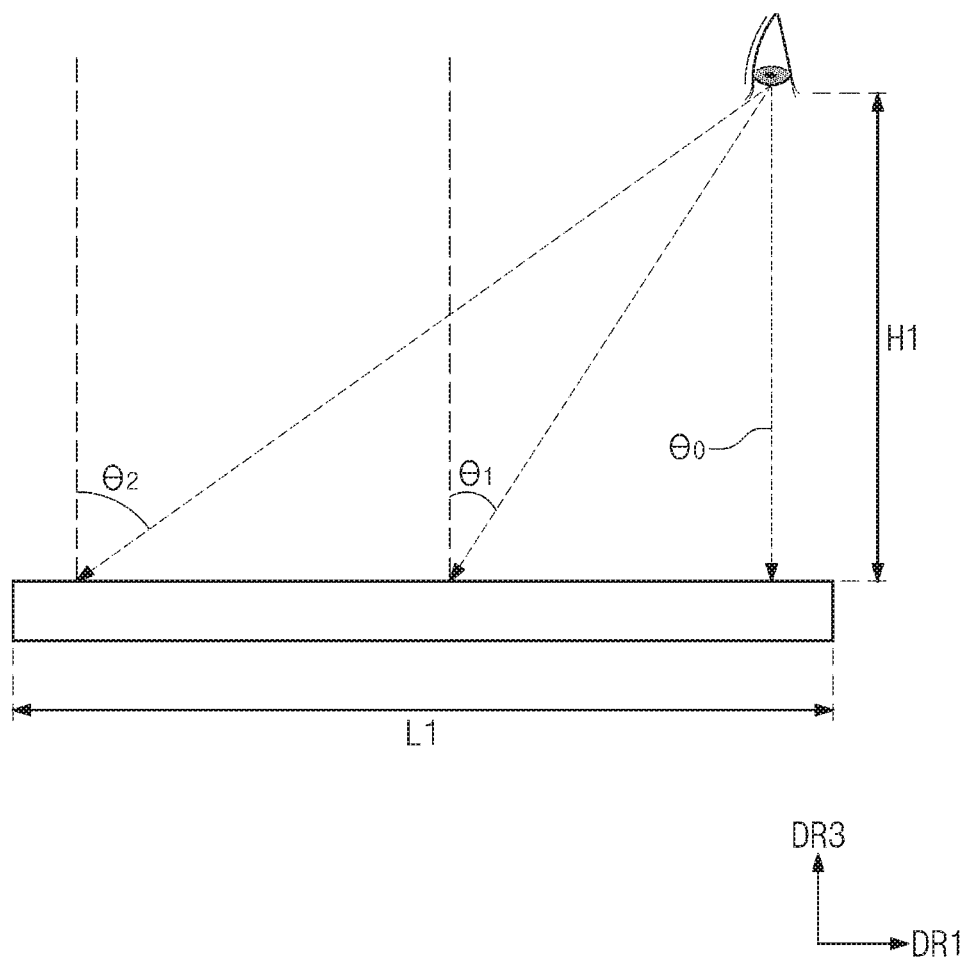
FIG. 1B is a side view of an electronic device according to an embodiment of the inventive concept.
Figure 2:
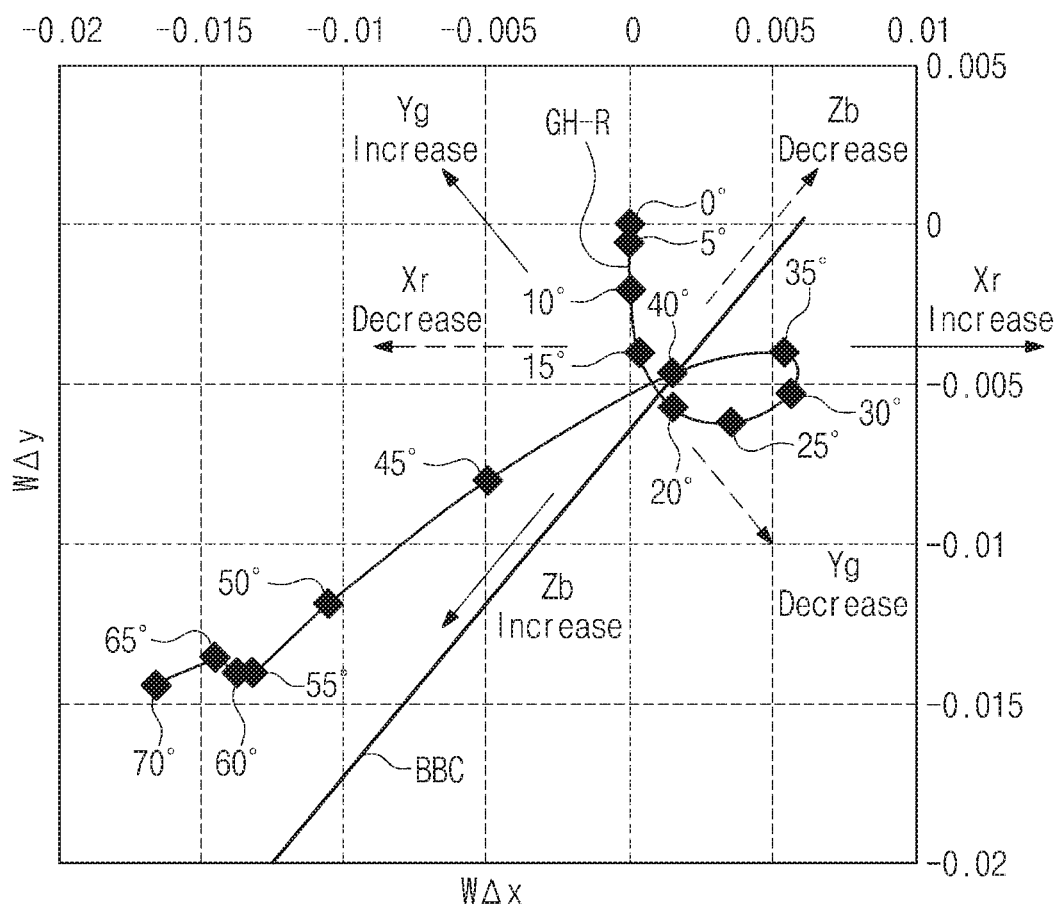
FIG. 2 is a graph showing optical characteristics of an electronic device according to a comparative example.
Figure 3A:
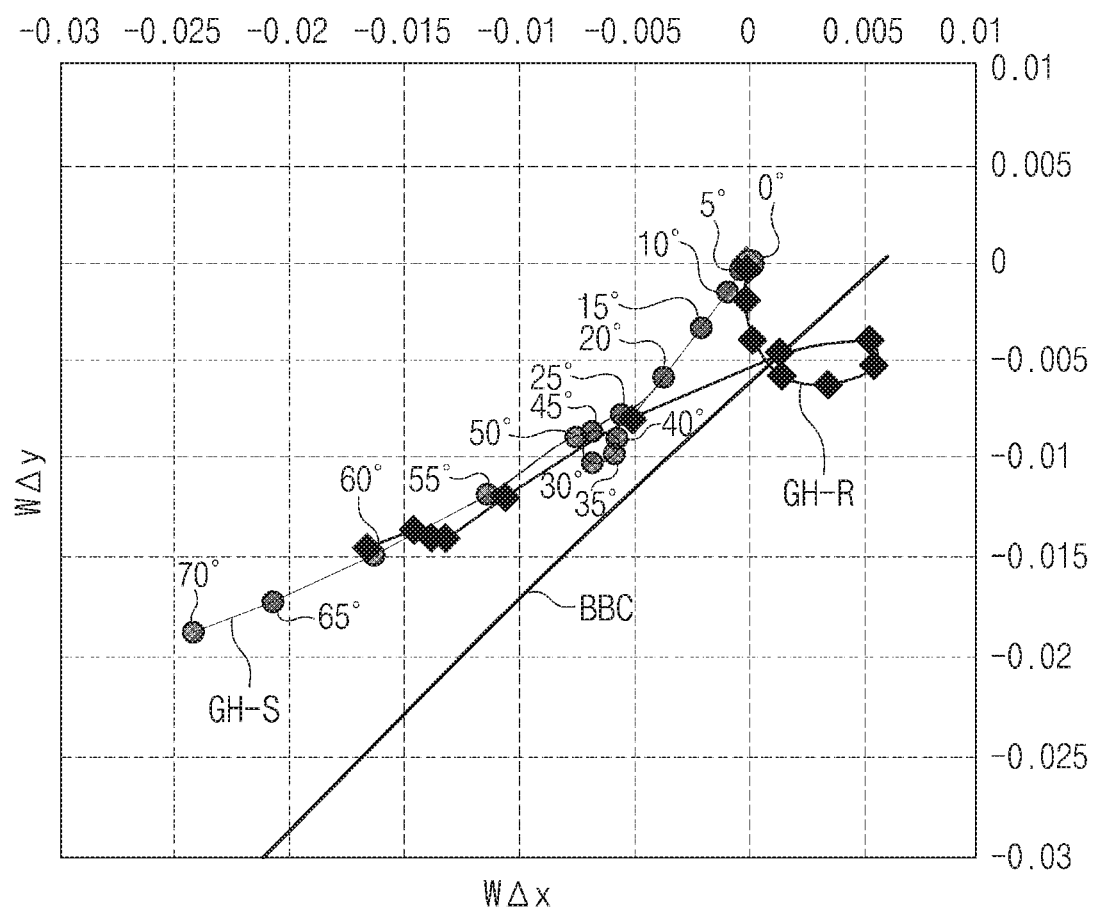
FIG. 3A is a graph showing optical characteristics of an electronic device according to an embodiment of the inventive concept.
Figure 3B:
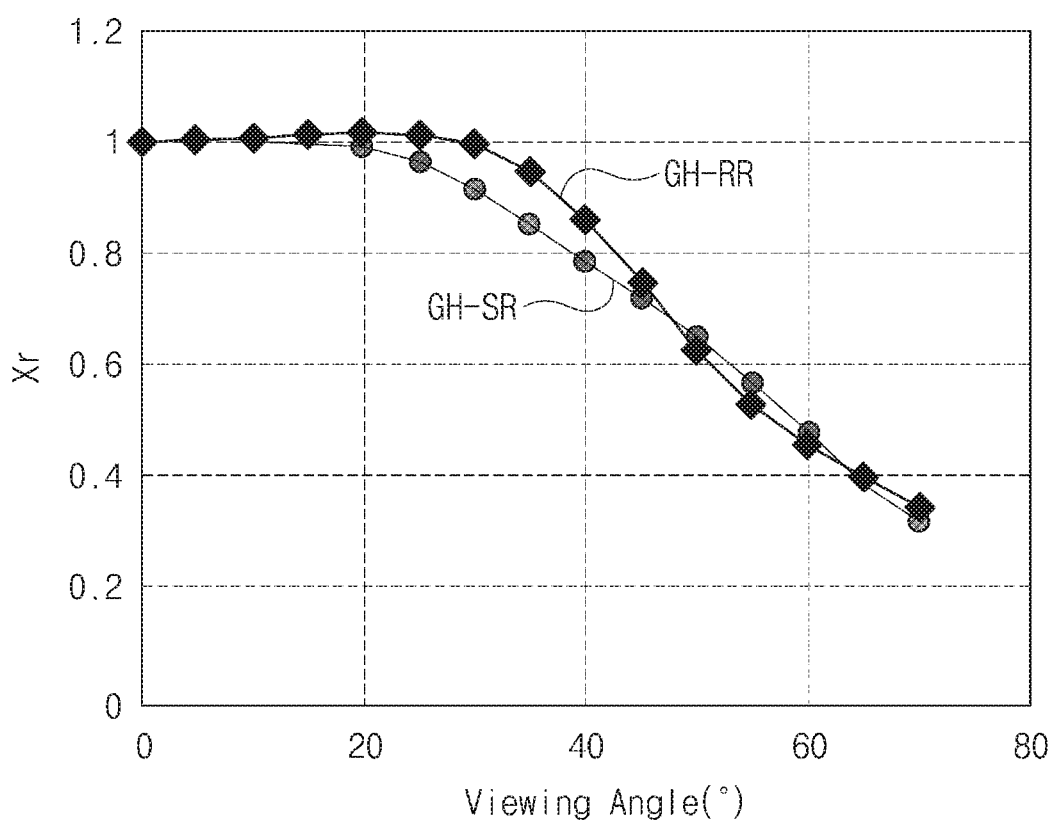
FIG. 3B is a graph showing a change in the tristimulus value of Xr according to the viewing angle of light emitted from an electronic device.

FIG. 1A is a perspective view of an electronic device ED according to an embodiment of the inventive concept. FIG. 1B is a side view of an electronic device ED according to an embodiment of the inventive concept. FIG. 2 is a graph showing optical characteristics of an electronic device according to a comparative example. FIG. 3A is a graph showing optical characteristics of an electronic device according to an embodiment of the inventive concept. FIG. 3B is a graph showing a change in the tristimulus value of Xr according to the viewing angle of light emitted from an electronic device ED.

As shown in FIGS. 1A and 1B, the electronic device ED may display an image IM through a display surface ED-IS. The display surface ED-IS is parallel to the plane defined by the first directional axis DR1 and the second directional axis DR2. The normal direction of the display surface ED-IS, that is, the thickness direction of the electronic device ED, is indicated by the third directional axis DR3.

When the direction in which the image is displayed is set to be the same as the third direction axis DR3, an upper surface (or a front surface) and a lower surface (or a rear surface) of each of the elements are defined by the third direction axis DR3. Hereinafter, the first to third directions indicate the same directions as those indicated by the first and third direction axis DR1, DR2, DR3, and are indicated by the same reference numerals as those of the first to third direction axes DR1, DR2, and DR3, respectively.

In an embodiment of the inventive concept, an electronic device ED having a planar display surface is shown, but is not limited thereto. The electronic device ED may further include a curved display surface. The electronic device ED may include a stereoscopic display surface. The stereoscopic display surface includes a plurality of display areas indicating different directions, and may include, for example, a polygonal columnar display surface.

The electronic device ED according to this embodiment may be a rigid display device. However, without being limited thereto, the electronic device ED according to the inventive concept may be a flexible electronic device ED having the shape of FIG. 1A in an unfolded state. In this embodiment, the electronic device ED applicable to a portable terminal is exemplarily shown. Although not shown in the drawing, electronic modules, camera modules, and power modules mounted on a main board may be arranged in a bracket/case together with an electronic device (ED) to constitute a mobile phone terminal.

As shown in FIGS. 1A and 1B, the display surface ED-IS includes a display area ED-DA in which an image IM is displayed and a non-display area ED-NDA adjacent to the display area ED-DA. The non-display area ED-NDA is an area where no image is displayed. FIG. 1A shows icon images as an example of an image IM. The non-display area ED-NDA is typically the bezel of an electronic device.

The display area ED-DA may have a rectangular form. The non-display area ED-NDA may surround the display area ED-DA. However, the inventive concept is not limited thereto, and the shape of the display area ED-DA and the shape of the non-display area ED-NDA may be relatively designed. For example, a non-display area ED-NDA may be disposed only in an area facing in the first direction DR1.

As shown in FIGS. 1A and 1B, the viewing angles $\theta_0$, $\theta_1$, and $\theta_2$ are changed as a user looks at different positions of the electronic device ED at a specific position. Depending on the viewing angle, a white image displayed on the electronic device ED may look different to a user depending on the viewing angles $\theta_0$, $\theta_1$, and $\theta_2$. Here, the white image may be a background image or a single image displayed throughout the display area ED-DA.

Since the light emitted from the display panel DP (referring to FIG. 4A) are provided to the user differently depending on the viewing angles $\theta_0$, $\theta_1$, and $\theta_2$. The propagation path of the light corresponding to the first viewing angle $\theta_0$, the propagation path of the light corresponding to the second viewing angle $\theta_1$ and the propagation path of the light corresponding to the third viewing angle $\theta_2$ are different from each other. In addition, the light generated in the inside of the display panel DP (for example, the organic light emitting layer) passes through the plurality of layers and is emitted to the outside. Because the interference phenomenon by the plurality of layers varies depending on the propagation path of light, the white image displayed on the electronic device ED may look different to a user depending on the viewing angles $\theta_0$, $\theta_1$, and $\theta_2$.

The graphs described with reference to FIGS. 2 to 3B are based on tristimulus values of Xr, tristimulus values of Yg, and tristimulus values of Zb according to viewing angles. Xr is defined as the X tristimulus value of the red component of the spectrum of light, Yg is defined as the Y tristimulus value of the green component of the spectrum of light, and Zb is defined as the Z tristimulus value of the blue component of the spectrum of light. The graphs described below are shown in CIE 1931 color coordinates.

The graph shown in FIG. 2 shows the change in color tone according to the viewing angle of a white image displayed on an electronic device ED. Factors affecting greatly to the color change of the white image are the tristimulus value of Xr for the red wavelength range, the tristimulus value of Yg for the green wavelength range, and the tristimulus value of Zb for the blue wavelength range. These results may be expressed as follows.

$$W\Delta x=-0.0227+0.0934Xr+0.0196Yg-0.0917Zb$$

$$W\Delta y=-0.00777+0.0337Xr+0.142Yg-0.167Zb$$

In Equations above, WΔx represents a displacement of white color according to an x-axis and WΔy represents a displacement of white color according to a y-axis.

The above relational expression means that a change in luminance in the red wavelength range, the green wavelength range, and the blue wavelength range affects the color change of the white image. If the luminance change in the red wavelength range, the green wavelength range, and the blue wavelength range is controllable according to the viewing angle, the change in color tone according to the viewing angle of the white image may be controlled.

Based on the spectra of light measured at different viewing angles at a 30 cm height H1 from an electronic device ED, the tristimulus value according to the viewing angle is calculated. A tristimulus value is calculated from a spectrum of light using a color matching function, and a tristimulus value is normalized to calculate a color coordinate value according to a viewing angle.

The measurement of the spectrum of the light emitted from the electronic device ED at the 30 cm height H1 (see FIG. 1B) reflects a condition using the portable terminal by the user.

The black body curve (BBC) shown in FIG. 2 corresponds to white. The spectrum of light measured at a viewing angle of 0° (the first viewing angle $\theta_0$ in FIG. 1B) was set as a reference value. The spectrum of the light corresponding to the reference value may be expressed by a color coordinate of (0, 0).

The first graph GH-R is the spectrum of the light emitted from the electronic device according to the comparative example. According to the first graph GH-R, the color coordinates corresponding to the viewing angle of 20° to 40° are arranged on the lower or right side of the black body curve (BBC). Thus, when looking at a viewing angle of 20° to 40°, the white image displayed on the electronic device ED becomes reddish-white. In relation to the spectrum of the light measured corresponding to the viewing angle of 20° to 40°, a tristimulus value of Xr may be large or a tristimulus value of Yg may be small in comparison to the black body curve (BBC).

For a white image displayed on an electronic device (ED, see FIG. 1A) with a length (L1, see FIG. 1B) of 10 cm to 20 cm, the image is recognized as white at a 30 cm height H1 when viewed at a viewing angle of 0°. However, the image is recognized as a reddish white at a 30 cm height H1 when viewed at a viewing angle of 20° to 40°.

A second graph GH-S in FIG. 3A is an analysis of the spectrum of light emitted from an electronic device according to an embodiment of the inventive concept. According to the second graph GH-S, the color coordinates corresponding to the viewing angle of 20° to 40° are arranged on the upper or left side of the black body curve (BBC). Thus, when looking at a viewing angle of 20° to 40°, the white image is not recognized as reddish-white.

Here, it may be seen that the color coordinates outside the range of 20° to 40° of the second graph GH-S do not change significantly with respect to the first graph GH-R. This is because, as will be described later, a layer having an optical distance of a predetermined thickness or more is controlled, and a layer having an optical distance of a predetermined thickness or less is fixed to a constant thickness.

The first graph GH-RR shown in FIG. 3B shows a change in the tristimulus value of Xr according to the viewing angle of the electronic device according to the comparative example. The second graph GH-SR shown in FIG. 3B shows a change in the tristimulus value of Xr according to the viewing angle of the electronic device according to an embodiment of the inventive concept. The spectrum of the light emitted from the electronic device is measured according to the viewing angle, and the tristimulus value of Xr is calculated from the measured spectrum. According to this embodiment, it may be seen that the tristimulus value of Xr in an embodiment of the inventive concept is decreased as compared with the comparative example at a viewing angle of 20° to 40°. Also, it may be seen that the tristimulus value of the Xr outside the viewing angle range of 20° to 40° of the second graph GH-SR is not significantly changed with respect to the first graph GH-RR. In the embodiment of the inventive concept, it is possible to reduce the tristimulus value of Xr to prevent the reddish white image.

Unlike the embodiment described with reference to FIGS. 3A and 3B, in an embodiment of the inventive concept, the tristimulus value of Yg may be increased to prevent the reddish white image. On the other hand, since the tristimulus value of Zb increases or decreases along the black body curve, the effect on the reddish white image of the tristimulus value of Zb is not significant.

According to the inventive concept, by controlling the material and the thickness of the upper stacked structure disposed on the display panel, the tristimulus value of Xr and the tristimulus value of Yg of the light emitted from an electronic device may be periodically controlled. This control may reduce the tristimulus value of Xr periodically or increase the tristimulus value of Yg periodically. The tristimulus value of Xr may be periodically decreased and the tristimulus value of Yg may be periodically increased at the same time. Hereinafter, the upper stacked structure and the optical distance will be described in more detail with reference to FIGS. 4A to 10.

Figure 4A:
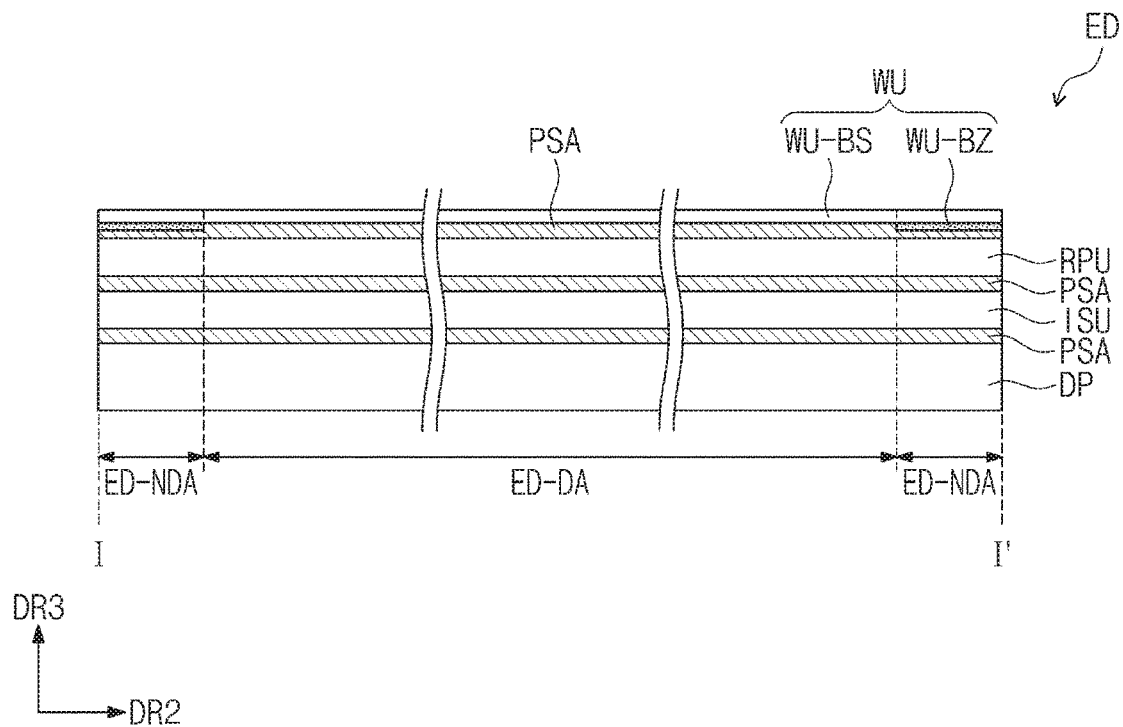
FIGS. 4A and 4B are cross-sectional views of an electronic device according to an embodiment of the inventive concept.
Figure 4B:
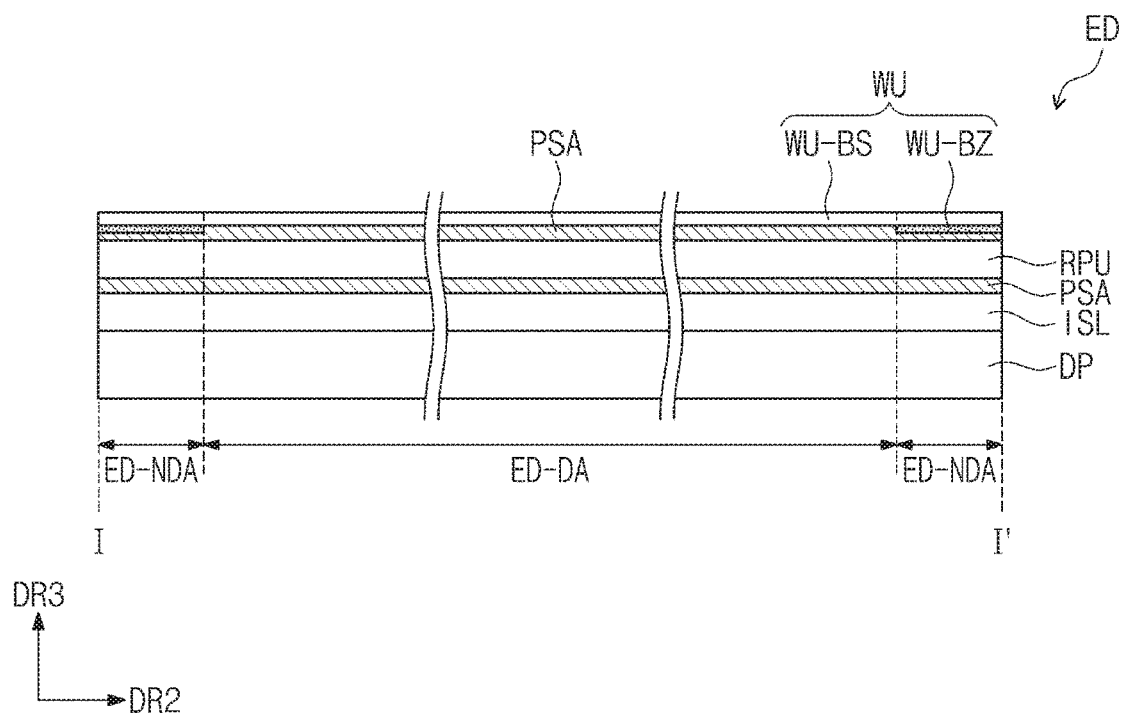
Figure 5:
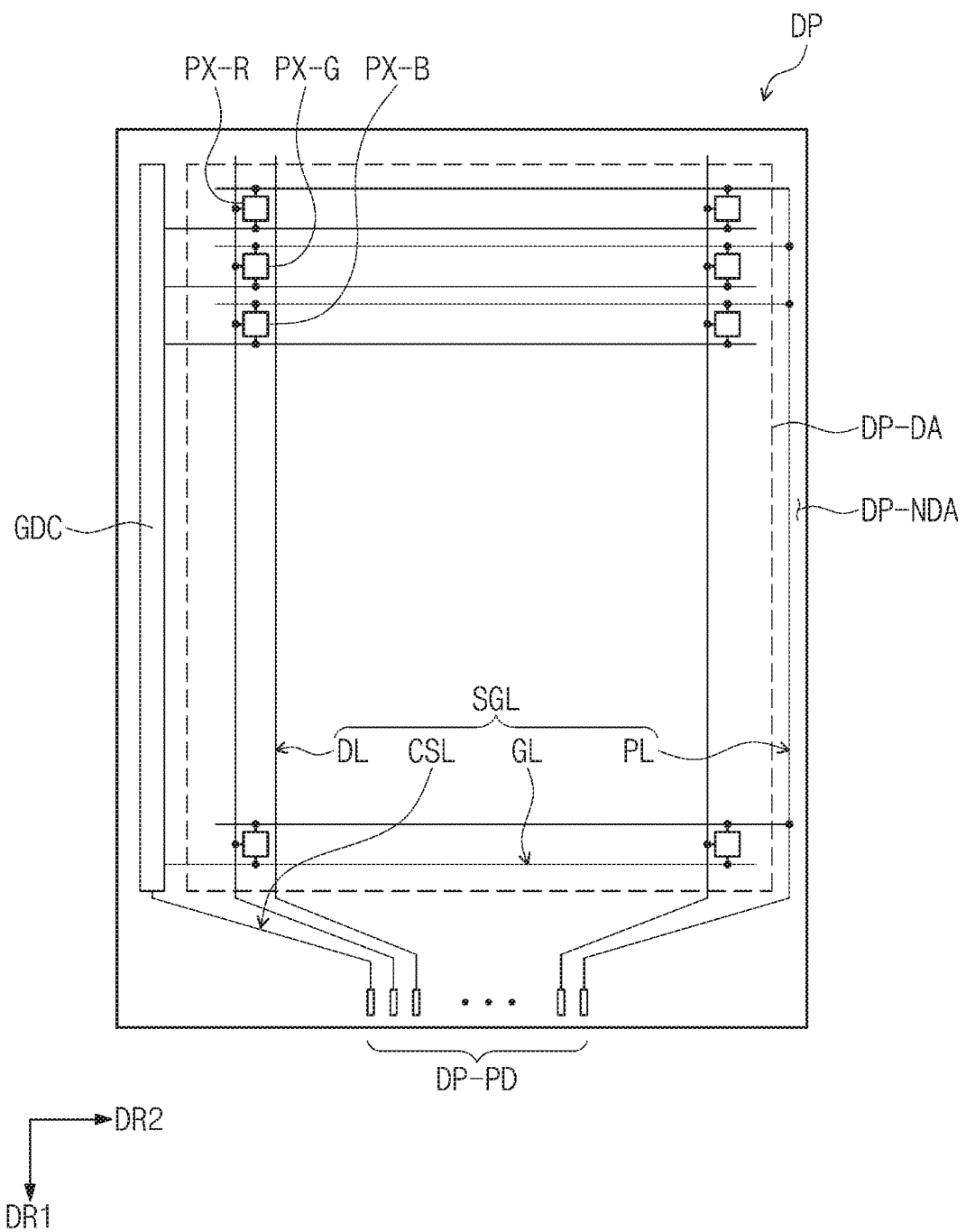
FIG. 5 is a plan view of a display panel according to an embodiment of the inventive concept.
Figure 6A:
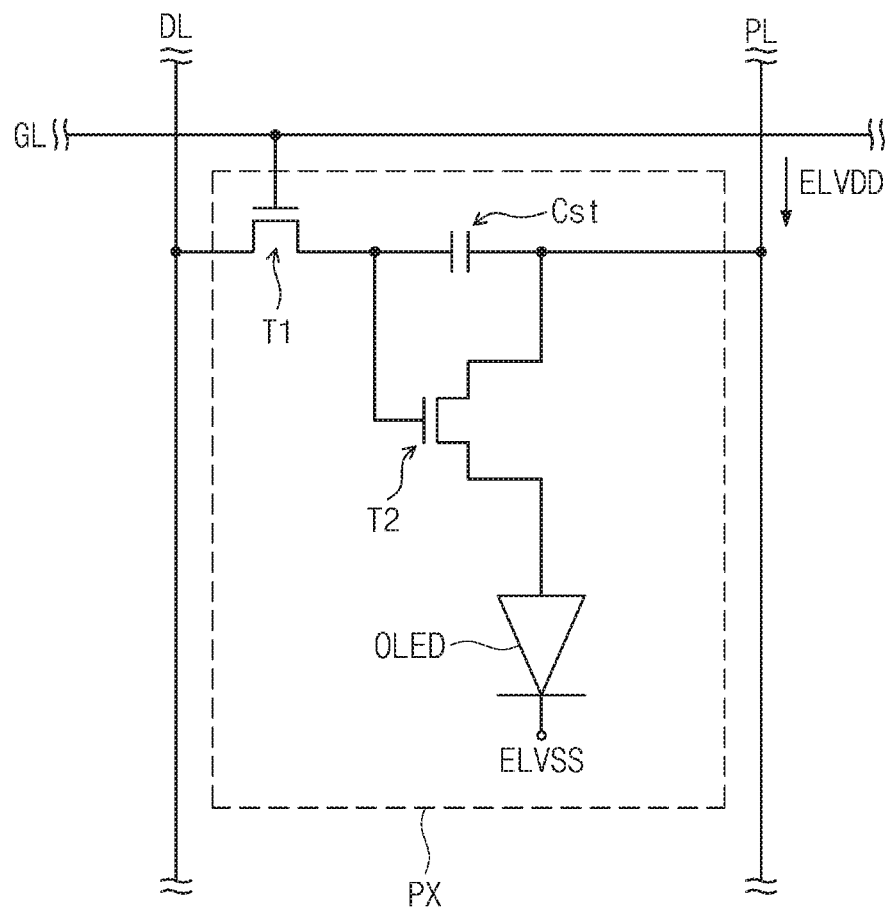
FIG. 6A is an equivalent circuit diagram of a pixel according to an embodiment of the inventive concept.
Figure 6B:
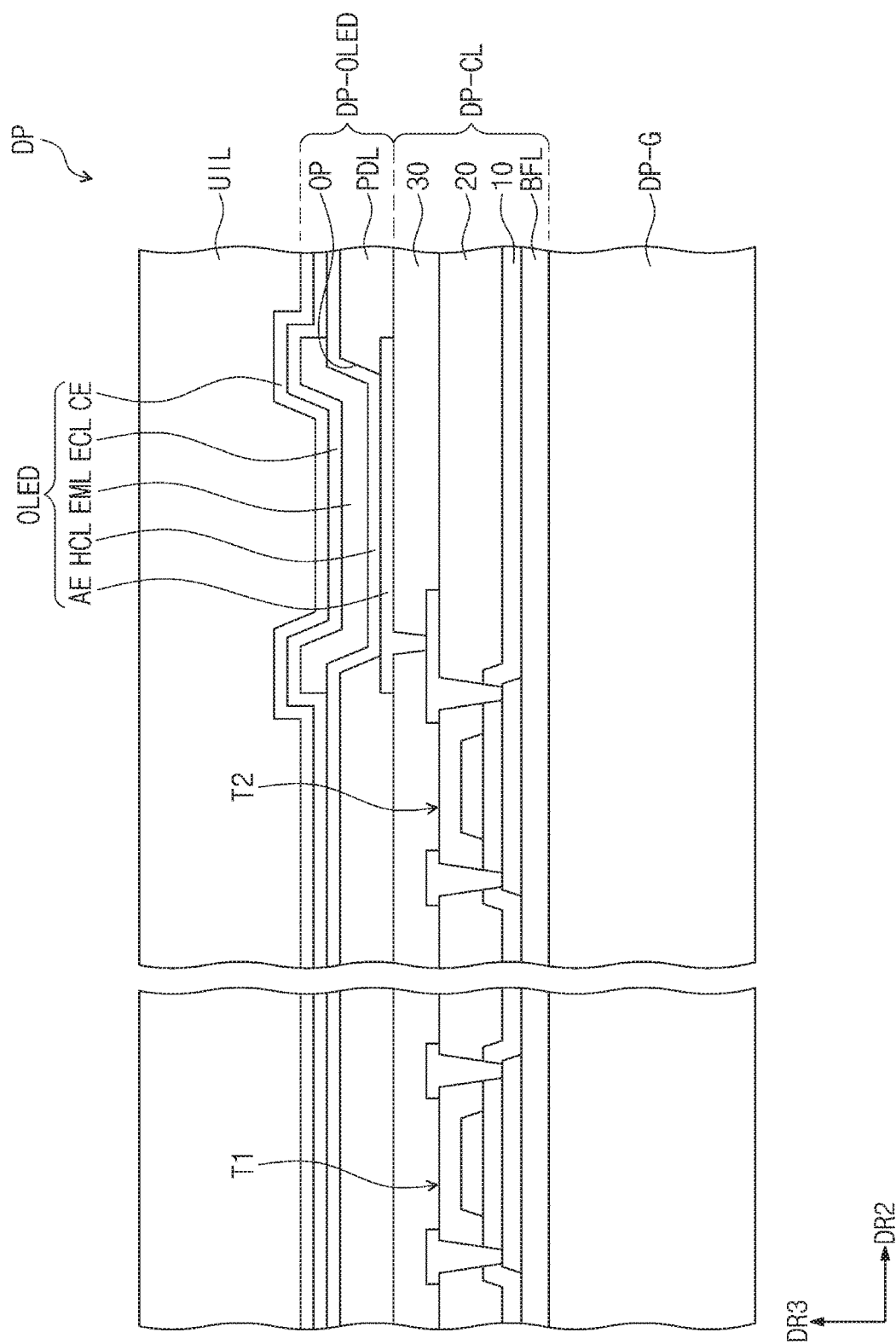
FIG. 6B is a cross-sectional view of a display panel according to an embodiment of the inventive concept.
Figure 6C:
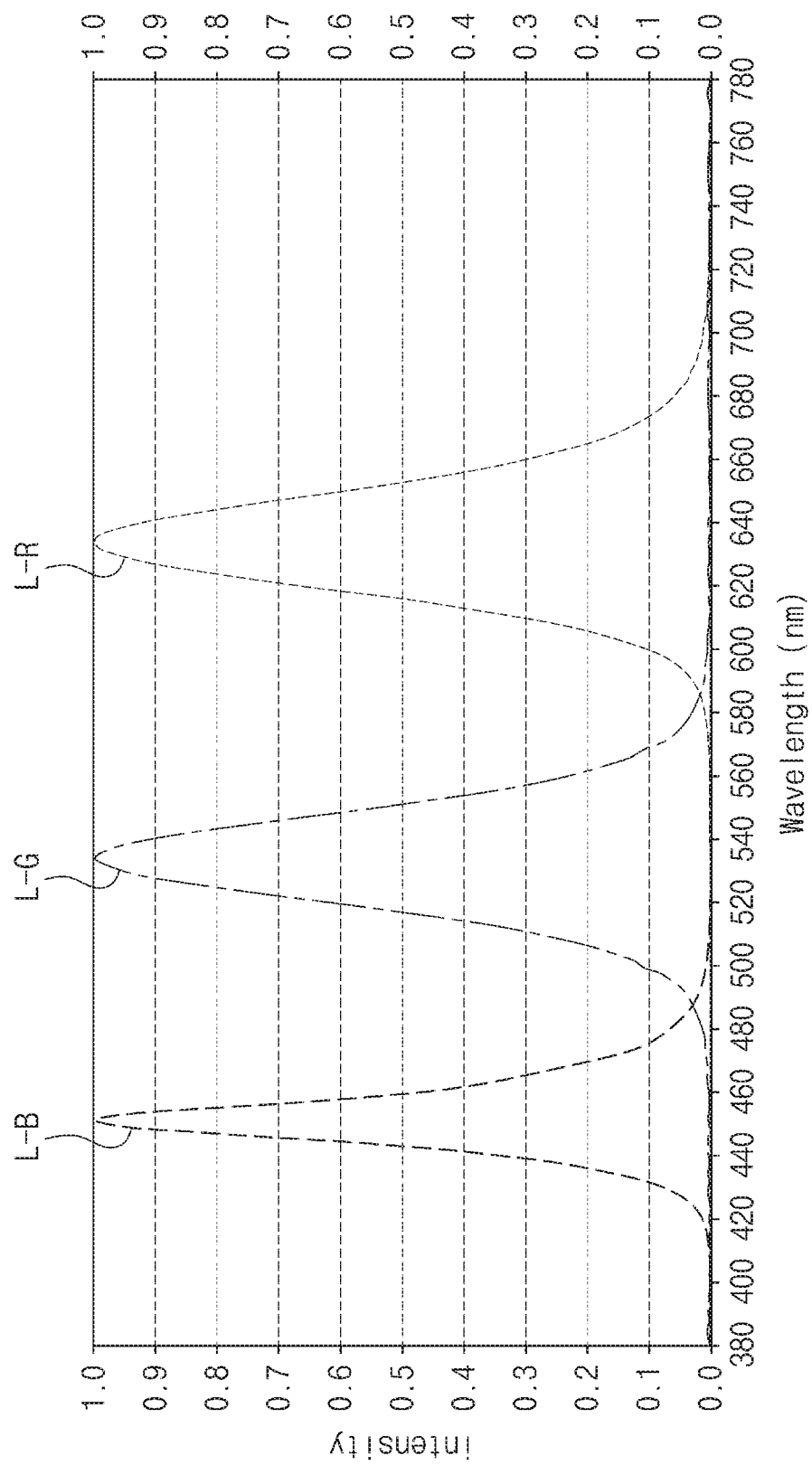
FIG. 6C is a graph showing the emission spectrum of the light generated from a display panel according to an embodiment of the inventive concept.

FIGS. 4A and 4B are cross-sectional views of an electronic device ED according to an embodiment of the inventive concept. FIG. 5 is a plan view of a display panel DP according to an embodiment of the inventive concept. FIG. 6A is an equivalent circuit diagram of a pixel PX according to an embodiment of the inventive concept. FIG. 6B is a cross-sectional view of a display panel DP according to an embodiment of the inventive concept. FIG. 6C is a graph showing the emission spectrum of the light generated from the display panel DP according to an embodiment of the inventive concept.

An electronic device ED according to an embodiment of the inventive concept may include a display panel DP, an input sensor ISU, an anti-reflector RPU, and a window WU. The display panel DP generates an image, and the input sensor ISU acquires coordinate information of an external input (e.g., a touch event). The anti-reflector RPU reduces the reflectance of light incident from the outside, and the window WU provides the display surface ED-IS. At least some of the configurations of the display panel DP, the input sensor ISU, the anti-reflector RPU and the window WU are formed by a continuous process, or at least some configurations may be coupled together via an adhesive member.

FIGS. 4A and 4B illustrate a pressure sensitive adhesive film (PSA) as an adhesive member. The adhesive member described below may include conventional adhesives or gluing agents and is not particularly limited. In an embodiment of the inventive concept, the anti-reflector RPU may be replaced with another configuration or omitted. In an embodiment of the inventive concept, the input sensor ISU may be omitted.

Referring to FIG. 4A, the display panel DP according to an embodiment of the inventive concept may be a light-emitting type display panel. For example, the display panel DP may be an organic light emitting display panel or a quantum dot light emitting display panel. The light emitting layer of the organic light emitting display panel may include an organic light emitting material. The light emitting layer of the quantum dot light emitting display panel may include quantum dot, quantum rod, and the like. Hereinafter, the display panel DP is described as an organic light emitting display panel.

The input sensor ISU may include at least one conductive layer and at least one insulating layer. At least one conductive layer may include a plurality of sensor electrodes. The input sensor ISU may include a plurality of sensor electrodes, such as capacitive touch panels.

The anti-reflector RPU reduces the reflectance of natural light (or sunlight) incident from above the window WU. The anti-reflector RPU according to an embodiment of the inventive concept may include a retarder and a polarizer. The retarder may be a film type or a liquid crystal coating type, and may include a λ/2 retarder and/or a λ/4 retarder. The polarizer may also be of film type or liquid crystal coating type. The film type includes a stretch-type synthetic resin film, and the liquid crystal coating type may include liquid crystals arranged in a predetermined arrangement. The retarder and the polarizer may further include a protective film. The retarder and the polarizer itself or the protective film may be defined as the base layer of the anti-reflector RPU.

The anti-reflector RPU according to an embodiment of the inventive concept may include color filters. The color filters have a predetermined arrangement. The arrangement of the color filters may be determined in consideration of the light emission colors of the pixels included in the display panel DP. The anti-reflector RPU may further include a black matrix disposed adjacent to the color filters.

The window WU according to an embodiment of the inventive concept includes a base layer WU-BS and a light blocking pattern WU-BZ. The base layer WU-BS may include a glass substrate and/or a synthetic resin film or the like. The base layer WU-BS is not limited to a single layer. The base layer WU-BS may include two or more films bonded with an adhesive member.

The light blocking pattern WP-BZ partially overlaps the base layer WU-BS. The light blocking pattern WU-BZ may be disposed on the back surface of the base layer WU-BS to define a bezel area of the display device ED, that is, a non-display area EDNDA (see FIG. 1A).

The light blocking pattern WU-BZ may be formed as a colored organic film, for example, by a coating method. Although not shown separately, the window WU may further include a functional coating layer disposed on the front surface of the base layer WU-BS. The functional coating layer may include an anti-fingerprint layer, anti-reflective layer, and a hard coating layer.

The input sensor ISU, the anti-reflector RPU, and the window WU shown in FIG. 4A may have a panel shape and coupled to one another using an adhesive member. According to the inventive concept, the input sensor ISU, the anti-reflector RPU, and the window WU are not limited to a panel shape. The input sensor ISU, the anti-reflector RPU, and the window WU according to an embodiment of the inventive concept may have multi-layer structure sequentially disposed on the base.

The multi-layer structure is formed through a series of processes with different configurations. In other words, the lowest layer of the multi-layer structure is disposed on the base. The base may be separately provided or the display panel DP may be the base. FIG. 4B illustrates an electronic device including an input sensing layer ISL exemplarily. The lowest layer of the input sensing layer ISL, for example, an insulating layer or a conductive layer, may be directly disposed on the uppermost layer (base surface) of the display panel DP.

As shown in FIG. 5, the display panel DP includes a driving circuit GDC, a plurality of signal lines SGL (hereinafter referred to as signal lines), a plurality of signal pads DP-PD (hereinafter referred to as signal pads), and a plurality of pixels PX-R, PX-G, and PX-B (hereinafter referred to as pixels). The driving circuit GDC may include a scan driving circuit. The signal lines SGL may include scan lines GL, data lines DL, a power line PL, and a control signal line CSL. The control signal line CSL may provide control signals to a scan driving circuit. The signal pads DP-PD are connected to corresponding signal lines among the signal lines SGL. The signal pads DP-PD may be connected to a circuit board not shown.

The display panel DP may include a pixel region DP-DA and a peripheral region DP-NDA on a plane. The pixel region DP-DA is a region where pixels PX-R, PX-G, and PX-B are arranged and the peripheral region DP-NDA is a region where no pixels PX-R, PX-G, and PX-B are arranged. The pixel region DP-DA and the peripheral region DP-NDA correspond to the display area ED-DA and the non-display area ED-NDA shown in FIG. 1A, but are not necessarily limited thereto.

Each of the pixels PX-R, PX-G, and PX-B includes an organic light emitting diode and a pixel driving circuit connected thereto. The pixels PX-R, PX-G, and PX-B may be divided into a plurality of groups according to the emitted color. The pixels PX-R, PX-G and PX-B may include, for example, red pixels PX-R, green pixels PX-G, and blue pixels PX-B. The pixels PX-R, PX-G, and PX-B may include organic light emitting layers of different materials.

FIG. 6A shows one pixel PX of the pixels PX-R, PX-G, and PX-B shown in FIG. 5. The organic light emitting diode OLED may be a front-light-emitting-type diode or a rear-light-emitting-type diode. The pixel PX includes a first transistor T1 (or a switching transistor), a second transistor T2 (or a driving transistor), and a capacitor Cst as a pixel driving circuit for driving the organic light emitting diode OLED. The first power voltage ELVDD is supplied to the second transistor T2 and the second power voltage ELVSS is supplied to the organic light emitting diode OLED. The second power voltage ELVSS may be lower than the first power voltage ELVDD.

The first transistor T1 outputs a data signal applied to the data line DL in response to a scan signal applied to the scan line GL. The capacitor Cst charges a voltage corresponding to a data signal received from the first transistor T1. The second transistor T2 is connected to the organic light emitting diode OLED. The second transistor T2 controls a driving current flowing through the organic light emitting diode OLED in correspondence to a charge amount stored in the capacitor Cst.

The equivalent circuit is only an embodiment and is not limited thereto. The pixel PX may further include a plurality of transistors, and may include a larger number of capacitors. The organic light emitting diode OLED may be connected between the power line PL and the second power voltage ELVS S.

As shown in FIG. 6B, a circuit element layer DP-CL and a display element layer DP-OLED are sequentially arranged on the base substrate DP-G. In this embodiment, the circuit element layer DP-CL may include a plurality of insulating layers. The plurality of insulating layers may include a buffer film BFL, a first inorganic film 10, a second inorganic film 20, and an organic film 30. The material of the inorganic film and the organic film is not particularly limited, and in an embodiment of the inventive concept, the buffer film BFL may be omitted.

The first transistor T1 and the second transistor T2 may be disposed on the buffer film BFL. On the other hand, according to another embodiment of the inventive concept, some of the first transistor T1 and the second transistor T2 may be modified as a bottom gate structure.

A pixel defining film PDL and an organic light emitting diode OLED may be disposed on the organic film 30. The pixel defining film PDL may include an organic material. A first electrode AE is disposed on the organic film 30. The first electrode AE is connected to the output electrode of the second transistor T2 through a through hole penetrating the organic film 30. An opening part OP is defined in the pixel defining film PDL. The opening part OP of the pixel defining film PDL exposes at least a part of the first electrode AE. In an embodiment of the inventive concept, the pixel defining film PDL may be omitted.

A hole control layer HCL, a light emitting layer EML, an electron control layer ECL, and a second electrode CE may be sequentially arranged on the first electrode AE. The hole control layer HCL may include a hole transport layer. The hole control layer HCL may further include a hole injection layer disposed between the hole transport layer and the first electrode AE. The electron control layer ECL may include an electron transport layer. The electron control layer ECL may further include an electron injection layer disposed between the electron transport layer and the second electrode CE. The second electrode CE may include silver (Ag), magnesium (Mg), aluminum (Al), and nickel (Ni).

An upper stacked structure UIL is disposed on the second electrode CE. The upper stacked structure UIL contains a plurality of insulating layers. The plurality of insulating layers may be divided into a plurality of groups according to their functions. A detailed description of the upper stacked structure UIL will be given later.

FIG. 6C shows emission spectra of light generated from the organic light emitting diodes of the red pixel PX-R, the green pixel PX-G, and the blue pixel PX-B. The Y axis represents the emission intensity and the emission intensities of the first graph L-B, the second graph L-G, and the third graph L-R are not related to each other.

As shown in the first graph L-B, the first light generated in the blue pixel PX-B has a peak in the first central wavelength range. Here, the central wavelength range is defined as the range in which the peak wavelength may be arranged. The first light may have a wavelength of at least 410 nm or more and 480 nm or less, and the first central wavelength range may be 440 nm or more and 460 nm or less. As shown in the second graph L-G, the second light generated in the green pixel PX-G has a peak in the second central wavelength range. The second light may have a wavelength of at least 500 nm or more and 570 nm or less, and the second central wavelength range may be 515 nm or more and 545 nm or less. As shown in the third graph L-B, the third light generated in the red pixel PX-R has a peak in the third central wavelength range. The third light may have a wavelength of at least 580 nm or more and 675 nm or less, and the third central wavelength range may be 610 nm or more and 645 nm or less.

FIGS. 7A to 7D are cross-sectional views showing a stacked structure of the display panels DP according to an embodiment of the inventive concept. FIG. 8 is a graph showing a change in a minimum perceptible color difference (MPCD) according to an optical distance of a display panel according to an embodiment of the inventive concept. FIGS. 7A to 7D show an organic light emitting diode OLED and an upper stacked structure UIL disposed on the organic light emitting diode OLED in a simplified way.

As shown in FIGS. 7A to 7D, the upper stacked structure UIL includes a plurality of layers. The layers of the upper stacked structure UIL are disposed adjacent to the organic light emitting diode OLED to cause an interference in the light emitted from the organic light emitting diode OLED. As shown in the second graph GH-S in FIG. 3A, the reason that the color coordinates measured at a viewing angle of 20° to 40° are arranged on the upper side or the left side of the black body curve is because the upper stacked structure UIL satisfies a specific condition described later.

The "specific condition" may be determined by the optical distance of the layers (hereinafter referred to as interference layers) disposed between the reference layers of the plurality of layers and the second electrode CE. The optical distance of a single layer is defined as the product of the refractive index of a single layer and the thickness of a single layer. The optical distance of a structure including a plurality of layers is defined as the sum of the optical distances of the plurality of layers.

As shown in FIG. 8, since the layers disposed farther than the optical distance of 4000 nm from the upper surface of the second electrode CE are arranged farther than the interference distance of the organic light emitting diode OLED, thus, interference effect is low and does not affect the change of tristimulus value. Therefore, the reference layer is a layer in which the upper surface is disposed within an optical distance of 4000 nm from the upper surface of the second electrode CE and may be determined as an interference layer disposed on the uppermost one of the above-described interference layers.

That is, the interference layers satisfy the following equations. $n_{1,z}$ is the refractive index in the thickness direction of the first interference layer with respect to the peak wavelength. d1 is the thickness of the first interference layer. $n_{q,z}$ is the refractive index in the thickness direction of the reference layer with respect to the peak wavelength. dq is the thickness of the reference layer.

$$n_{1,z}d_1 + n_{2,z}d_2 \ldots n_{q,z}d_q \leq 4000 \text{ nm}$$

As shown in FIGS. 7A to 7D, the upper stacked structure UIL may include a first protective layer CPL, a second protective layer PCL, and an encapsulation layer TFE. The upper stacked structure UIL may further include layers other than the above layers, or some of the layers may be omitted.

The first protective layer CPL prevents damage to the second electrode CE from subsequent processes, for example, a plasma process. The first protective layer CPL may include an organic material. The first protective layer CPL may include, for example, a hole transport material called HT01. In addition, the first protective layer CPL may include other organic materials used in the organic light emitting diode OLED described with reference to FIG. 6B. The refractive index of the first protective layer CPL may be 1.5 to 2.2, and the thickness may be 45 nm to 120 nm.

The second protective layer PCL prevents damage to the first protective layer CPL, which is an organic layer, from the subsequent chemical vapor deposition process of the inorganic material. The second protective layer PCL may be formed by a sputtering method which is a physical vapor deposition method. The second protective layer PCL may include, for example, LiF. The refractive index of the second protective layer PCL may be 1.3 to 2.2, and the thickness may be 10 nm to 50 nm.

The encapsulation layer TFE seals the organic light emitting diode OLED. The encapsulation layer TFE may include at least one inorganic film (hereinafter referred to as a sealing inorganic film) and at least one organic film (hereinafter referred to as a sealing organic film).

The sealing inorganic film protects the organic light emitting diode OLED from moisture/oxygen, and the sealing organic film protects the organic light emitting diode OLED from foreign substances such as dust particles. The sealing organic film may include a silicon nitride layer, a silicon oxynitride layer, a silicon oxide layer, a titanium oxide layer, or an aluminum oxide layer and is not limited thereto. The sealing organic film may include an acrylic based organic film and is not particularly limited. The sealing inorganic film and the sealing organic film may be formed by a deposition method, and in particular, the sealing organic film may be formed by depositing an acrylic monomer.

Figure 7A:
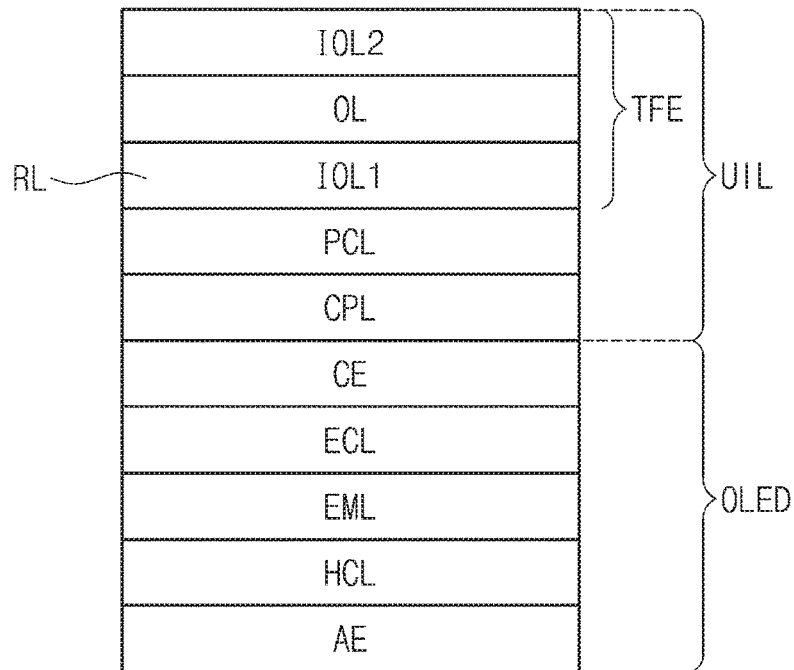
FIGS. 7A, 7B, 7C and 7D are cross-sectional views showing a stacked structure of display panels according to an embodiment of the inventive concept.
Figure 7B:
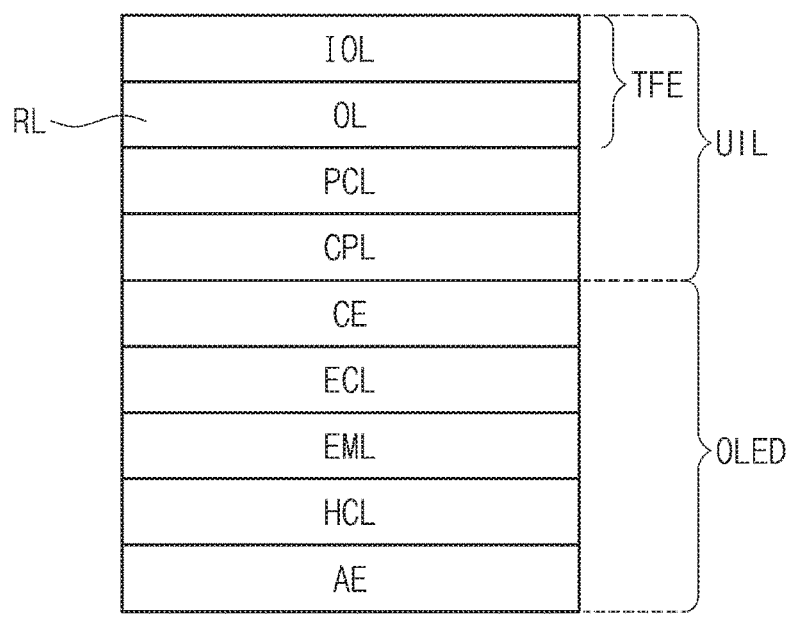
Figure 7C:
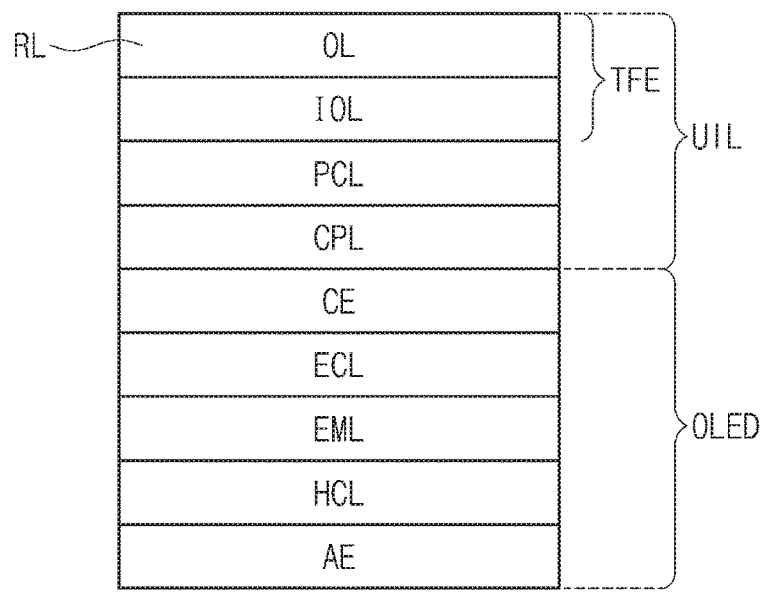
Figure 7D:
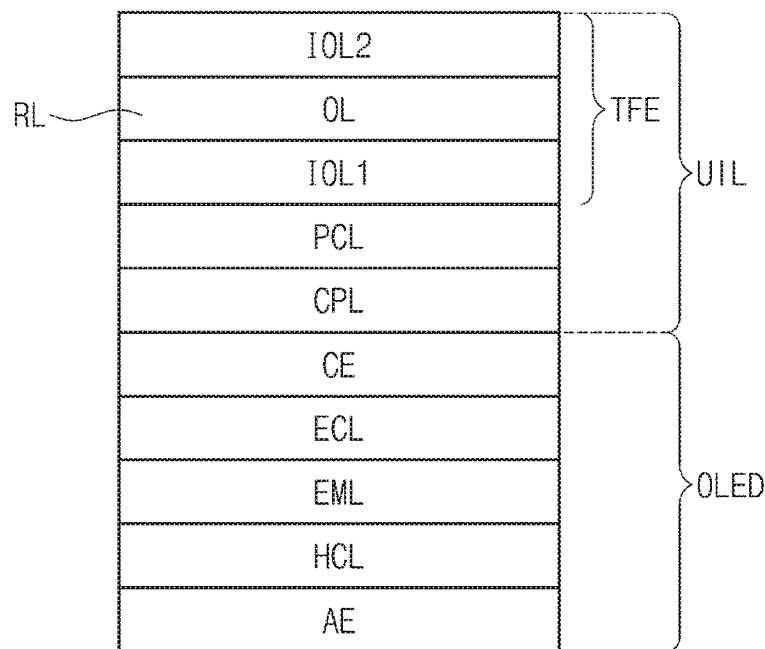
Figure 8:
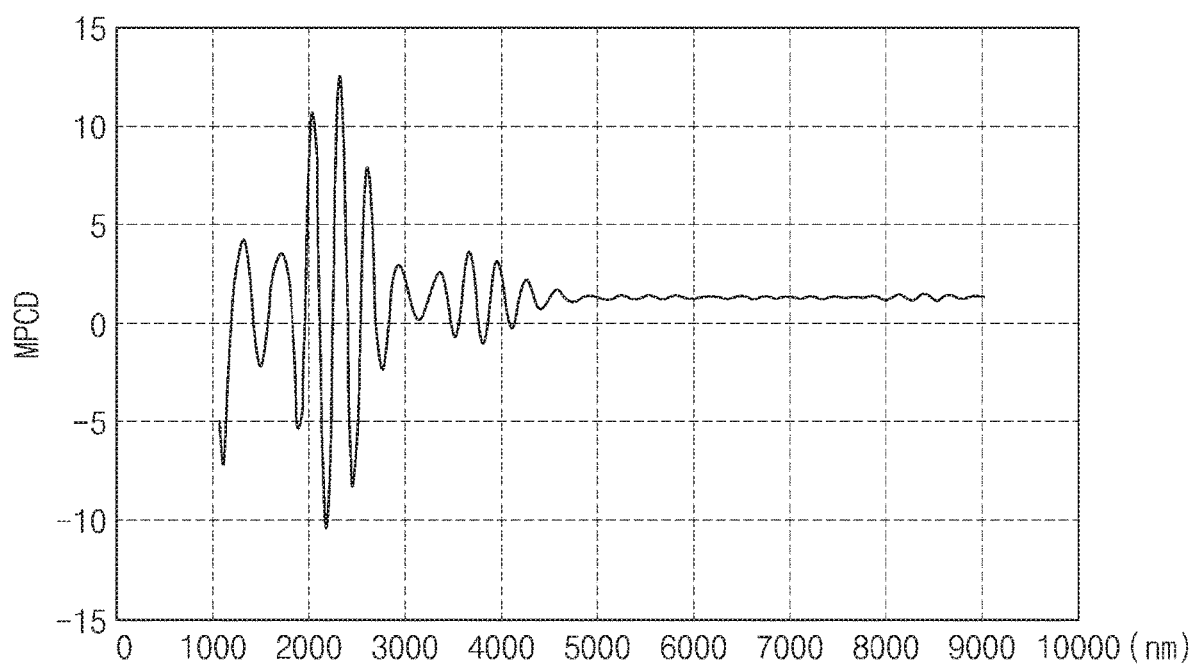
FIG. 8 is a graph showing a minimum a change in minimum perceptible color difference (MPCD) according to an optical distance of a display panel according to an embodiment of the inventive concept

FIG. 7A shows an encapsulation layer TFE in which a first sealing inorganic film IOL1, a sealing organic film OL, and a second sealing inorganic film IOL2 are sequentially stacked. FIG. 7B shows an encapsulation layer TFE in which a sealing organic film OL and a sealing inorganic film IOL are sequentially stacked. FIG. 7C shows an encapsulation layer TFE in which a sealing inorganic film IOL and a sealing organic film OL are sequentially stacked. FIG. 7D show a encapsulation layer TFE in which a first sealing inorganic film IOL1 a sealing organic film OL and a second sealing inorganic film IOL2 are sequentially stacked.

In the upper stacked structure UIL shown in FIG. 7A, the reference layer RL may be the first sealing inorganic film IOL1. Here, the refractive index of the first sealing inorganic film IOL1 may be 1.5 to 1.9, and the thickness may be 800 nm to 2000 nm. The refractive index of the sealing organic film OL may be 1.4 to 1.8, and the thickness may be 1000 nm to 12000 nm. The refractive index of the second sealing inorganic film IOL2 may be 1.5 to 1.9, and the thickness may be 800 nm to 2000 nm.

Since the thickness of the first protective layer CPL and the second protective layer PCL is relatively thin, the reference layer RL is determined by the stacked structure of the encapsulation layer TFE. In FIG. 7A, the first sealing inorganic film IOL1 having an upper surface arranged at an optical distance of 4000 nm from the upper surface of the second electrode CE is determined as a reference layer RL.

In the upper stacked structure UIL shown in FIG. 7B, the reference layer RL may be a sealing organic film OL. The refractive index of the sealing organic film OL may be 1.4 to 1.8, and the thickness may be 1000 nm to 3000 nm. The sealing inorganic film IOL may be formed under substantially the same conditions as the second sealing inorganic film IOL2 of FIG. 7A.

In the upper stacked structure UIL shown in FIG. 7C, the reference layer RL may be a sealing organic film OL. The refractive index of the sealing organic film OL may be 1.4 to 1.8, and the thickness may be 1000 nm to 2500 nm. In this case, the sealing inorganic film IOL may have a refractive index of 1.5 to 1.9 and a thickness of 500 nm to 1600 nm.

FIGS. 7B and 7C illustrate the upper stacked structure UIL in which the sealing organic film OL is the reference layer RL. However, in an embodiment of the inventive concept, a sealing inorganic film IOL may be the reference layer RL. At this time, the sealing organic film OL has a relatively thin thickness and the sealing inorganic film IOL has a relatively large thickness.

In the upper stacked structure UIL shown in FIG. 7D, the reference layer RL may be a sealing organic film OL. The refractive index of the sealing organic film OL may be 1.4 to 1.8, and the thickness may be 1000 nm to 2000 nm. At this time, the first sealing inorganic film IOL1 may be thinner than the first sealing inorganic film IOL1 of FIG. 7A. The refractive index of the first sealing inorganic film IOL1 may be 1.5 to 1.9, and the thickness may be 500 nm to 1600 nm. The second sealing inorganic film IOL2 may be formed under the same conditions as the second sealing inorganic film IOL2 of FIG. 7A. The refractive index of the second sealing inorganic film IOL2 may be 1.5 to 1.9, and the thickness may be 800 nm to 2000 nm.

Figure 9:
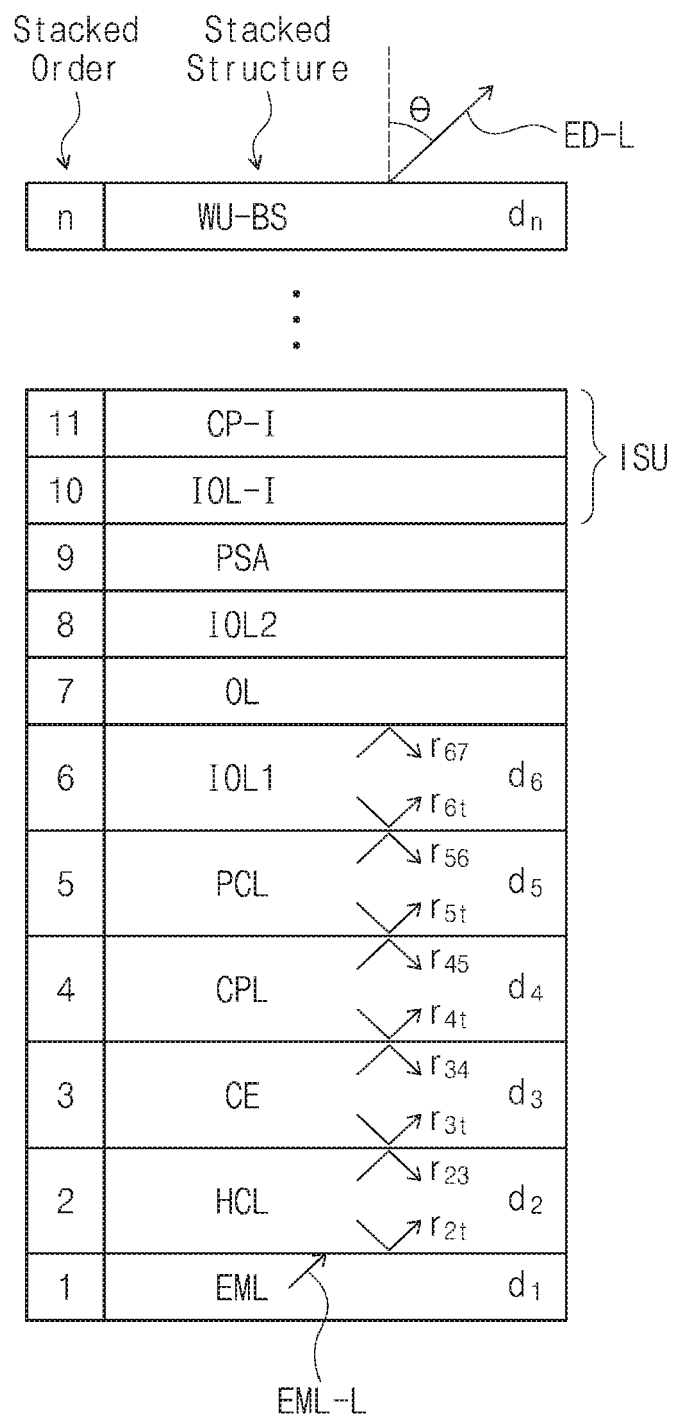
FIG. 9 is a cross-sectional view showing the propagation path of light generated from a display panel according to an embodiment of the inventive concept.
Figure 10A:
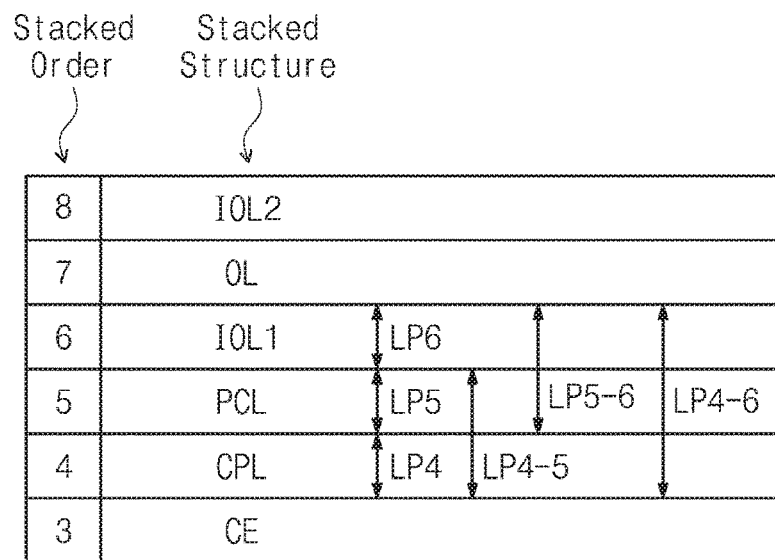
FIG. 10A is a cross-sectional view showing an optical interference path for a portion of an upper stacked structure according to an embodiment of the inventive concept.
Figure 10B:
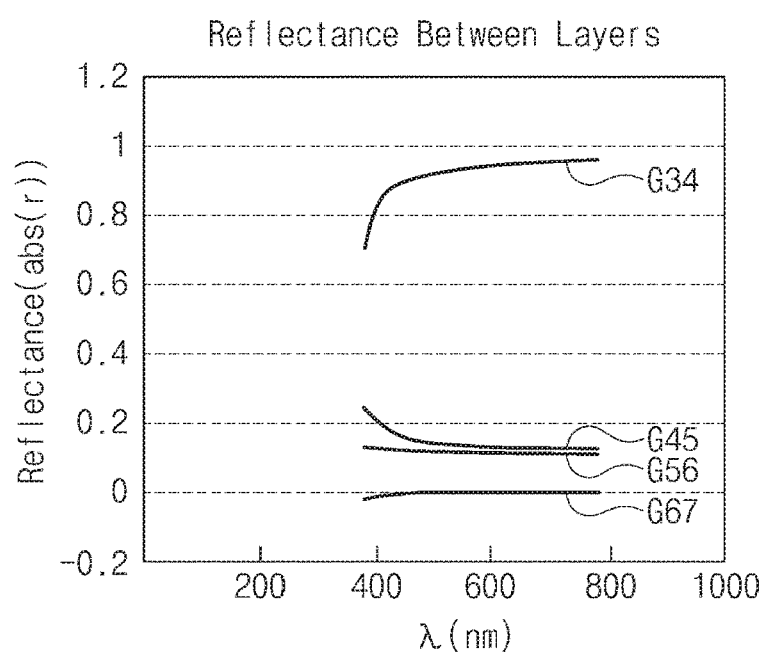
FIG. 10B is a graph showing the interlayer reflectance of an upper stacked structure according to an embodiment of the inventive concept.
Figure 10C:
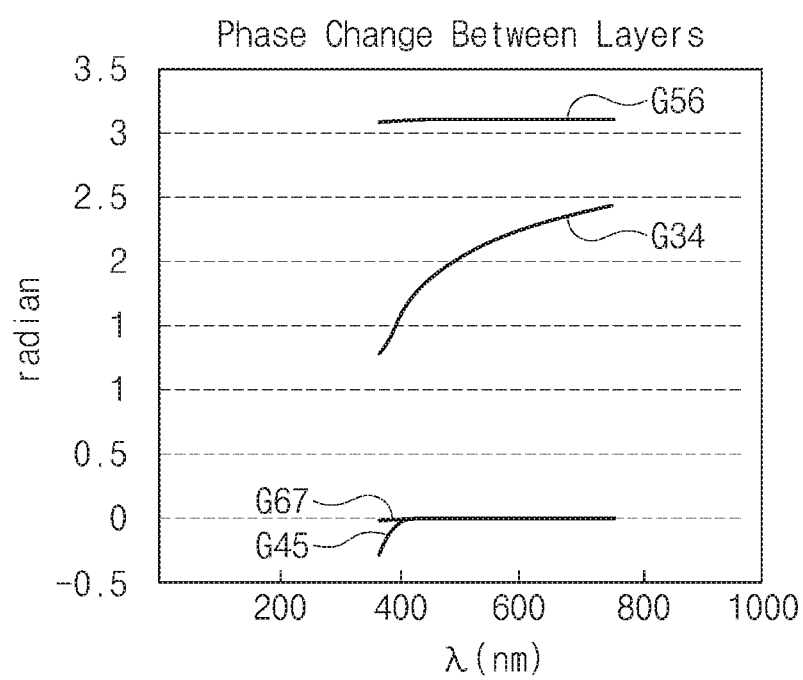
FIG. 10C is a graph showing the interlayer phase change of an upper stacked structure according to an embodiment of the inventive concept.

FIG. 9 is a cross-sectional view showing the propagation path of light generated from a display panel DP according to an embodiment of the inventive concept. FIG. 10A is a cross-sectional view showing an optical interference path for a portion of an upper stacked structure UIL according to an embodiment of the inventive concept. FIG. 10B is a graph showing the interlayer reflectance of an upper stacked structure UIL according to an embodiment of the inventive concept. FIG. 10C is a graph showing the interlayer phase change of an upper stacked structure UIL according to an embodiment of the inventive concept. Below, with reference to FIGS. 9 to 10C, the influence of the interference layers between the second electrode CE and the reference layer on the tristimulus value of light measured at a viewing angle of 20° to 40° will be described in more detail.

FIG. 9 shows a path through which light generated in a light emitting layer EML is emitted from an electronic device ED. The electronic device ED shown in FIG. 4A is shown as an example. According to this embodiment, the electronic device ED includes a panel shaped input sensor ISU, and defines the upper surface of the base layer WU-BS of the window WU as the uppermost surface of the electronic device ED. In addition, the input sensor ISU also includes one inorganic layer IOL-I and one conductive layer CP-I. This embodiment is described based on the electronic device ED including the upper stacked structure UIL shown in FIG. 7A. The first protective layer CPL, the second protective layer PCL, and the first sealing inorganic film IOL1 are shown in FIG. 9 as the fourth layer CPL, the fifth layer PCL and the sixth layer IOL1.

According to Equations 1 to 3, as the value of the spectral intensity $L_{e, \Omega, \lambda}$ increases, the tristimulus value of Xr, the tristimulus value of Yg, and the tristimulus value of Zb increase.

$$Xr = \int_\lambda L_{e\Omega\lambda}(\lambda)\bar{x}(\lambda)d\lambda \quad \text{Equation 1}$$

$$Yg = \int_\lambda L_{e\Omega\lambda}(\lambda)\bar{y}(\lambda)d\lambda \quad \text{Equation 2}$$

$$Zb = \int_\lambda L_{e\Omega\lambda}(\lambda)\bar{z}(\lambda)d\lambda \quad \text{Equation 3}$$

According to the following paper "Simulation of light emission from thin-film microcavities", Kristiaan A. Neyts, J. Opt. Soc. Am. A/Vol. 15, No. 4/April 1998", the intensity K value of light passing through a plurality of layers may be determined by Equation 4 below. The K value in Equation 4 may be substantially equal to the value of $L_{e, \Omega, \lambda}$ in Equations 1 to 3.

$$K = const \text{Re}\left[\frac{\beta^2}{K_e^3 K_{z,e}} \frac{(1 \pm \alpha_+)(1 \pm \alpha_-)}{(1-\alpha)}\right] \quad \text{Equation 4}$$

The intensity of light passing through n layers (where n is a natural number of 3 or more) expressed by Equation 4 may be applied to the intensity of light (ED-L, hereinafter referred to as external emission light) emitted from the electronic device ED in FIG. 9. This is because light (EML-L, hereinafter referred to as source light) generated in the light emitting layer EML-L passes through the plurality of layers, that is, the hole control layer HCL to the base layer WU-BS.

Equation 4 may be separated as shown in Equation 5 below to check interference effects of the i-th layer to the nth layer among the n layers.

On the other hand, the equations described herein are calculated under transverse-magnetic (TM) polarization conditions. The TM polarization conditions satisfy the following relationship.

$$r_{i(i+1)} = \frac{\frac{k_{z,i}}{n_i^2} - \frac{k_{z,i+1}}{n_{i+1}^2}}{\frac{k_{z,i}}{n_i^2} + \frac{k_{z,i+1}}{n_{i+1}^2}}$$

In Equation 5, K' represents the intensity of light incident on the i-th layer. Here, the light emitting layer is the first layer (i=1).

$$K = K' \frac{k_{i+1,z}}{k_{i,z}} \frac{|t_{i(i+1)}e^{i(k_{i,z}d_i)}|^2}{|(1-r_{(j)t}r_{(i)(i+1)}e^{2i(k_{i,z}d_i)})|^2} \times$$

$$\frac{k_{i+2,z}}{k_{i+1,z}} \frac{|t_{(i+1)(i+2)}e^{i(k_{i+1,z}d_{i+1})}|^2}{|(1-r_{(j+1)t}r_{(i+1)(i+2)}e^{2i(k_{i+1,z}d_{i+1})})|^2} \cdots \times$$

$$\frac{k_{air,z}}{k_{n,z}} \frac{|t_{n(n+1)}e^{i(k_{n,z}d_n)}|^2}{|(1-r_{nt}r_{Nair}e^{2i(k_{n,z}d_n)})|^2} \quad \text{Equation 5}$$

Equation 6 is the result of summarizing in correspondence with i=4 in Equation 5.

$$K = K' \frac{\left(|t_{45}t_{56} \cdots t_{(n-1)n}t_{n(n+1)}e^{i(k_{4,z}d_4+k_{5,z}d_5+\cdots+k_{n-1,z}d_{n-1}+k_{n,z}d_n)}|^2\right)}{\left(|(1-r_{4t}r_{45}e^{2ik_{4,z}d_4})(1-r_{5t}r_{56}e^{2ik_{5,z}d_5}) \cdots (1-r_{(n-1)t}r_{(n-1)n}e^{2i(k_{n-1,z}d_{n-1})})(1-r_{nt}r_{nair}e^{2i(k_{n,z}d_n)})|^2\right)} \frac{k_{air,z}}{k_{4,z}} \quad \text{Equation 6}$$

In Equation 6, d4 to d6, and do represent the thickness of each layer. r(i)(i+1) represents the reflection coefficient between the i-th layer and the (i+1)th layer. r(i)(t) represents the reflection coefficient between the i-th layer and the layers disposed below the i-th layer.

The denominator of Equation 6 is given by Equation 7 below.

$$|(1-r_{4t}r_{45}e^{2ik_{4,z}d_4})(1-r_{5t}r_{56}e^{2ik_{5,z}d_5}) \cdots$$
$$(1-r_{(N-1)t}r_{(N-1)N}e^{2i(k_{N-1,z}d_{N-1})})(1-r_{Nt}r_{Mair}$$
$$e^{2i(k_{N,1}d_N)})|^2 K_{2,z} \quad \text{Equation 7}$$

The denominator may be interpreted as the product of the bracket arguments. The bracket arguments are related to a plurality of layers, respectively. The influence of the fourth layer CPL to the sixth layer IOL1 on the intensity K of the external emission light may be expressed by Equation 8.

$$|(1-r_{4t}r_{45}e^{2ik_{4,z}d_4})(1-r_{5t}r_{56}e^{2i(k_{5,z}d_5)})(1-r_{6t}r_{67}e^{i(k_{6,z}d_6)})| \quad \text{Equation 8}$$

Equation 8 is solved to obtain the following Equation 9. Equation 8 is developed using the following relational expression.

$$r_{(i+1)t} = \frac{r_{(i+1)i} - r_{it}e^{2ik_{i,z}d_i}}{1 - r_{it}r_{i(i+1)}e^{2ik_{i,z}d_i}}$$

The six arguments excluding 1 in Equation 9 represent six interference occurring in the fourth layer CPL to the sixth layer IOL1 as shown in FIG. 10A. The first argument of the six arguments corresponds to the first interference path LP4 of FIG. 10A, the second argument corresponds to the second interference path LP5 of FIG. 10A, the third argument corresponds to the third interference path LP6 of FIG. 10A, the fourth argument corresponds to the fourth interference path LP4-5 of FIG. 10A, the fifth argument corresponds to the fifth interference path LP5-6 of FIG. 10A, and the sixth argument corresponds to the sixth interference path LP4-6 of FIG. 10A.

The denominator of Equation 6 may be adjusted by controlling six arguments. When the denominator value of Equation 6 is decreased, the intensity K value of the external emission light is increased, and when the denominator value is increased, the intensity K value of the external emission light is decreased.

Of the six interference paths, the sixth interference path LP4-6 is set as the main argument. The second interference path LP5, the third interference path LP6, and the fifth interference path LP5-6 may be neglected because the reflection coefficient between the adjacent layers is small, thus, resonance occurs weakly.

In FIG. 10B, the first graph G34 shows the reflectance between the third layer CE and the fourth layer CPL, the second graph G45 shows the reflectance between the fourth layer CPL and the fifth layer PCL, the third graph G56 shows the reflectance between the fifth layer PCL and the sixth layer IOL1, and the fourth graph G67 shows the reflectance between the sixth layer IOL1 and the seventh layer OL.

The reflection coefficient between adjacent layers in the first interference path LP4 and the fourth interference path LP4-5 is relatively large. However, the fourth layer CPL and the fifth layer PCL which are thinner than the thickness of the sixth layer IOL1 do not affect a light efficiency and an optical characteristic much. However, the light efficiency and the 45° optical characteristic are affected by changes in the thicknesses of the fourth layer CPL and the fifth layer PCL. For example, in the second graph GH-S shown in FIG. 3A, in order not to significantly change the color coordinates outside the viewing angle range of 20° to 40°, the factors corresponding to the first interference path LP4 and the fourth interference path LP4-5 are fixed, and the intensity K of the external emission light is controlled by adjusting only the sixth factor corresponding to the sixth interference path LP4-6.

Here, the relatively thin thickness range of the fourth layer CPL and the fifth layer PCL may be equal to or more than 10 nm and equal to or less than 300 nm. The sixth argument of Equation 9 may be expressed as Equation 10 below.

$$r_{4t}r'_{67}e^{2i(k_{4,z}d_4+k_{5,z}d_5+k_{6,z}d_6)} = |r_{4t}|e^{i\phi_{4,t}}|r_{67}|e^{i\phi_{6,7}}e^{2i(k_{4,z}d_4+k_{5,z}d_5+k_{6,z}d_6)} \quad \text{Equation 10}$$

Equation 10 represents separately the phase which is an argument affecting the interference. In FIG. 10C, the first graph G34 shows the phase change of the light reflected from the interface between the third layer CE and the fourth layer CPL, the second graph G45 shows the phase change of the light reflected from the interface between the fourth layer CPL and the fifth layer PCL, the third graph G56 shows the phase change of the light reflected from the interface between the fifth layer PCL and the sixth layer IOL1, and the fourth graph G67 shows the phase change of the light reflected from the interface between the sixth layer IOL1 and the seventh layer OL. As in the first graph G34, the phase of light passing through the interface between the third layer CE and the fourth layer CPL is changed depending on the wavelength of light.

As a result, Equation 6 may be expressed as Equation 11.

$$K = K' \frac{|t_{45}t_{56} \dots t_{(n-1)n}t_{n(n+1)}e^{i(k_{4,z}d_4+k_{5,z}d_5+\dots+k_{n-1,z}d_{n-1}+k_{n,z}d_n)}|^2}{|1 - \dots - |r_{4t}||r_{67}|e^{2i(k_{4,z}d_4+k_{5,z}d_5+k_{6,z}d_6)+i\phi_{4,t}+i\phi_{6,7}} \dots |r_{n(n-1)}||r_{n(n+1)}|e^{2i(k_{n,z}d_n)}|^2} \frac{k_{air,z}}{k_{4,z}} \quad \text{Equation 11}$$

When Equation 11 is changed to a cosine value and the absolute value is solved, Equation 12 as follows.

$$K = K' \frac{|t_{45}t_{56} \dots t_{(n-1)n}t_{n(n+1)}e^{i(k_{4,z}d_4+k_{5,z}d_5+\dots+k_{n-1,z}d_{n-1}+k_{n,z}d_n)}|^2}{1 - \dots - 2|r_{4t}||r_{67}|\cos(2(k_{4,z}d_4+k_{5,z}d_5+k_{6,z}d_6)+\phi_{4,t}+\phi_{6,7})+4|r_{4t}|^2|r_{67}|^2 \dots} \frac{k_{air,z}}{k_{4,z}} \quad \text{Equation 12}$$

In Equation 12, the cosine function of the denominator is as follows. $\cos(2(k_{4,z}d_4+k_{5,z}d_5+k_{6,z}d_6)+\phi_{4,t}+\phi_{5,7})$ The intensity K value of the external emission light expressed by Equation 12 may be increased or decreased by the bracket argument of the cosine function. That is, the tristimulus value of Xr, the tristimulus value of Yg, and the tristimulus value of Zb may be increased or decreased by the bracket argument of the cosine function.

The cosine function may be generalized as Equation 13 below.

$$\cos(2(k_{1,z}d_1+k_{2,k}d_2 \dots +k_{q,z}d_q)+\phi_{1,CE}+\phi_{q,q+1}) \quad \text{Equation 13}$$

In Equation 12, the fourth layer CPL is expressed by the first layer in Equation 13, and the first layer is a layer contacting the upper surface of the second electrode CE. A plurality of layers are sequentially stacked from the first layer to the q-th layer. The q-th layer corresponds to the above-mentioned reference layer.

If the value of the bracket argument of Equation 13 $\cos(2(k_{1,z}d_1+k_{2,z}d_2 \dots +k_{q,z}d_q)+\phi_{1,CE}+\phi_{q,q+1})$ is 0, $2\pi$, $4\pi$. . . , the intensity K of the external emission light expressed by Equation 12 increases. That is, constructive interference occurs in the stacked structure from the first layer to the q-th layer.

If the value the bracket arguement of Equation 13 $\cos(2(k_{1,z}d_1+k_{2,z}d_2 \dots +k_{q,z}d_q)+\phi_{1,CE}+\phi_{q,q+1})$ is $\pi$, $3\pi$. . . , the intensity K value of the external emission light expressed by Equation 12 decreases. That is, destructive interference occurs in the stacked structure from the first layer to the q-th layer.

As shown in FIG. 3A, in order for the first graph GH-R to change like the second graph GH-S, the tristimulus value of Xr should be decreased or the tristimulus value of Yg should be increased. Alternatively, both two conditions should be satisfied.

In order to reduce the tristimulus value of Xr, the intensity of the external light, that is, the K value, should be decreased, and the bracket arguments of Equation 13 should satisfy Equation 14 below.

$$2\pi m + \frac{2\pi}{3} < 2k_{1,z}d_1 + 2k_{2,z}d_2 \dots + 2k_{q,z}d_q + \phi_{1,CE} + \phi_{q,q+1}, \quad \text{Equation 14}$$

$$< 2\pi m + \frac{4\pi}{3}$$

Here, m may be 0, 1, 2, . . . . d1 to dp are the thickness argument of each layer, for example, d1 is the thickness of the first layer. In Equation 14, $k_{i,z}$ are expressed by Equation 15 below.

$$K_{i,z} = \sqrt{n_i^2 - \sin^2\theta_{air}} \frac{2\pi}{\lambda} \quad \text{Equation 15}$$

Equation 14 may be expressed as Equation 16 using Equation 15.

$$2\pi m + \frac{2\pi}{3} < 2n_{1,z}d_1 \sqrt{1 - \frac{1}{n_1^2}\sin^2\theta_{air}} \frac{2\pi}{\lambda} + \quad \text{Equation 16}$$

$$2n_{2,z}d_2 \sqrt{1 - \frac{1}{n_2^2}\sin^2\theta_{air}} \frac{2\pi}{\lambda} \dots 2n_{q,z}d_q$$

$$\sqrt{1 - \frac{1}{n_q^2}\sin^2\theta_{air}} \frac{2\pi}{\lambda} + \phi_{1,CE} + \phi_{q,q+1} < 2\pi m + \frac{4\pi}{3}$$

hair may be an emission angle θ of the external emission light ED-L shown in FIG. 9, which may be the viewing angle shown in FIG. 1B. θair may be 20° to 40°. Especially, θair may be 30°. λ is the peak wavelength of the light incident on the first layer. Herein, $n_{1,z}$ is the refractive index in the thickness direction of the first layer with respect to the peak wavelength.

In Equations 14 and 16, $\Phi_{1,CE}$ are as shown in the following Equation 17.

$$\phi_{1,CE} = \tan^{-1}\left(\frac{\text{Im}(r_{1,CE})}{\text{Re}(r_{1,CE})}\right) \quad \text{Equation 17}$$

Here, $r_{1,CE}$ represent the reflection coefficients of the first layer for the organic light emitting diode OLED, that is, the layer contacting the upper surface of the second electrode CE. In other words, $r_{1,CE}$ represents the reflection coefficient of the layer contacting the upper surface of the second electrode CE for the structure from the first electrode AE to the second electrode CE to the second electrode CE. Therefore, $\Phi_{1,CE}$ may be determined according to the refractive indices of the second electrode CE and the first electrode AE, and the thicknesses and refractive indices of the layers disposed between the second electrode CE and the first electrode AE. $r_{1,CE}$ may contain imaginary values and real values. When $\text{Im}(r_{1,CE}) \geq 0$, the conditions of $0 \leq \Phi_{1,CE} \leq \pi$ are satisfied and when $\text{Im}(r_{1,CE}) < 0$, the conditions of $\phi < \Phi_{1,CE} < 2\pi$ are satisfied.

If the refractive index of the q-th layer (or reference layer) is greater than the refractive index of the (q+1) th layer, $\Phi_{q,q+1}$ are $\pi$, and If the refractive index of the q-th layer (or reference layer) is smaller than the refractive index of the (q+1)-th layer, $\Phi_{q,q+1}$ are 0.

The tristimulus value of Xr may be reduced by destructively interfering with the light generated from the red pixel PX-R. Therefore, $\lambda$ may be 610 nm or more and 645 nm or less.

In order to increase the tristimulus value of Yg, the intensity of the external emission light, that is, the K value, should be increased, and Equation 18 should be satisfied. The arguments of Equation 18 are the same as those of Equation 16.

$$2\pi m + \frac{5\pi}{3} < 2n_{1,z}d_1\sqrt{1 - \frac{1}{n_1^2}\sin^2\theta_{air}}\frac{2\pi}{\lambda} + \quad \text{Equation 18}$$

$$2n_{2,z}d_2\sqrt{1 - \frac{1}{n_2^2}\sin^2\theta_{air}}\frac{2\pi}{\lambda} \ldots 2n_{q,z}d_q$$

$$\sqrt{1 - \frac{1}{n_q^2}\sin^2\theta_{air}}\frac{2\pi}{\lambda} + \phi_{1,CE} + \phi_{q,q+1} < 2\pi(m+1) + \frac{\pi}{3}$$

The tristimulus value of Yg may be increased by constructively interfering with the light generated from the blue pixel PX-B. Therefore, $\lambda$ may be 515 nm or more and 545 nm or less.

Equations 16 and 18 may be satisfied to reduce the tristimulus value of Xr and increase the tristimulus value of Yg. In such a way, the tristimulus value of Xr of the light emitted from the electronic device may be reduced to prevent the reddish phenomenon of the white image. The tristimulus value of Yg of the light emitted from the electronic device may be increased to prevent the reddish phenomenon of the white image.

According to the above description, when the characteristics of light measured at a viewing angle of 20° to 40° are displayed in color coordinates, the coordinates are arranged on the left side or the upper side of the black body curve. The tristimulus value of Xr of the light emitted from the electronic device may be reduced to prevent the reddish phenomenon of the white image. The tristimulus value of Yg of the light emitted from the electronic device may be increased to prevent the reddish phenomenon of the white image.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. An electronic device comprising:
   a light emitting display panel; and
   a window disposed on the light emitting display panel,
   wherein when the light emitting display panel displays a single white image, a graph showing an intensity of light of the single white image measured at a height of 30 cm from the window and at a viewing angle of 20° to 40° in the CIE 1931 color coordinates is disposed on the left and top of a block body curve.

2. The electronic device of claim 1, wherein the light emitting display panel comprises:
   a first light emitting element configured to generate red light;
   a second light emitting element configured to generate green light;
   a third light emitting element configured to generate blue light; and
   interference layers disposed on the first light emitting element, the second light emitting element, and the third light emitting element,
   wherein the red light is extinctively interfered in the interference layers, and the blue light is constructively interfered in the interference layers.

3. The electronic device of claim 2, wherein a first interference layer to a q-th interference layer (q is a natural number of 3 or more) among the interference layers satisfy at least one of Equation 1 and Equation 2 below, and
   wherein the first interference layer contacts with the first light emitting element, the second light emitting element, and the third light emitting element, $$2\pi m + \frac{2\pi}{3} < 2n_{1,z}d_1\sqrt{1 - \frac{1}{n_1^2}\sin^2\theta_{air}}\frac{2\pi}{\lambda} + \quad \text{[Equation 1]}$$

$$2n_{2,z}d_2\sqrt{1 - \frac{1}{n_2^2}\sin^2\theta_{air}}\frac{2\pi}{\lambda} \ldots 2n_{q,z}d_q$$

$$\sqrt{1 - \frac{1}{n_q^2}\sin^2\theta_{air}}\frac{2\pi}{\lambda} + \phi_{1,CE} + \phi_{q,q+1} < 2\pi m + \frac{4\pi}{3}$$

$$2\pi m + \frac{5\pi}{3} < 2n_{1,z}d_1\sqrt{1 - \frac{1}{n_1^2}\sin^2\theta_{air}}\frac{2\pi}{\lambda} + \quad \text{[Equation 2]}$$

$$2n_{2,z}d_2\sqrt{1 - \frac{1}{n_2^2}\sin^2\theta_{air}}\frac{2\pi}{\lambda} \ldots 2n_{q,z}d_q$$

$$\sqrt{1 - \frac{1}{n_q^2}\sin^2\theta_{air}}\frac{2\pi}{\lambda} + \phi_{1,CE} + \phi_{q,q+1} < 2\pi(m+1) + \frac{\pi}{3}$$

in Equations 1 and 2, m is 0 and a natural number, $n_{1,z}$ to $n_{q,z}$ are refractive indices in a thickness direction of each of the first layer to the q-th layer, $d_1$ to $d_q$ are respective thicknesses of the first layer to the q-th layer, θair is 20° to 40°, λ in Equation 1 is 610 nm or more and 645 nm or less, and λ in Equation 2 is 515 nm or more and 545 nm or less, in Equations 1 and 2, Φ1,CE is the following Equation 3, $$\phi_{1,CE} = \tan^{-1}\left(\frac{\text{Im}(r_{1,CE})}{\text{Re}(r_{1,CE})}\right) \quad \text{[Equation 3]}$$

in Equation 3, r1,CE is defined as a reflection coefficient of the first layer for the light emitting element, and if Im(r1,CE)≥0, 0≤Φ1,CE≤π and if Im(r1,CE)<0, π<Φ1,CE<2π, and in Equations 1 and 2, if the refractive index of the q-th layer is larger than the refractive index of a layer disposed directly above the q-th layer, Φq,q+1 is π and if the refractive index of the q-th layer is smaller than the refractive index of the layer disposed directly above the q-th layer, Φq,q+1 is 0.

4. The electronic device of claim 3, wherein the first interference layer to the q-th interference layer satisfy Equation 4 below, $$n_{1,x}d_1 + n_{2,x}d_2 \ldots n_{q,x}d_q \leq 4000 \text{ nm} \quad \text{[Equation 4]}$$

5. The electronic device of claim 1, wherein a display surface where a single white image is displayed on the window is defined by a first direction axis and a second direction axis, wherein a length of the display surface along the first directional axis is 10 cm to 20 cm.

6. The electronic device of claim 1, further comprising at least one of an input sensor and an anti-reflector disposed between the window and the light emitting display panel.

* * * * *